United States Patent
Goto et al.

(10) Patent No.: US 7,241,666 B2
(45) Date of Patent: Jul. 10, 2007

(54) METHOD FOR MANUFACTURING SEMICONDUCTOR DEVICE

(75) Inventors: Yuugo Goto, Atsugi (JP); Yumiko Fukumoto, Atsugi (JP); Toru Takayama, Atsugi (JP); Junya Maruyama, Ebina (JP); Takuya Tsurume, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 239 days.

(21) Appl. No.: 10/967,279

(22) Filed: Oct. 19, 2004

(65) Prior Publication Data
US 2005/0112805 A1    May 26, 2005

(30) Foreign Application Priority Data
Oct. 28, 2003    (JP)    ............... 2003-368029

(51) Int. Cl.
H01L 21/46    (2006.01)
H01L 21/30    (2006.01)
H01L 21/84    (2006.01)
H01L 21/20    (2006.01)

(52) U.S. Cl. .................. 438/455; 438/149; 438/459; 257/E21.122

(58) Field of Classification Search ............... 438/455, 438/458–459, 977, 149; 257/E21.122
See application file for complete search history.

(56) References Cited

U.S. PATENT DOCUMENTS

| 5,206,749 | A | 4/1993 | Zavracky et al. |
| 5,258,325 | A | 11/1993 | Spitzer et al. |
| 5,317,236 | A | 5/1994 | Zavracky et al. |
| 5,341,015 | A | 8/1994 | Kohno |
| 5,376,561 | A | 12/1994 | Vu et al. |
| 5,674,304 | A | 10/1997 | Fukada et al. |
| 5,757,456 | A | 5/1998 | Yamazaki et al. |

(Continued)

FOREIGN PATENT DOCUMENTS

| EP | 1 178 521 | 2/2002 |
| JP | 10-125929 | 5/1998 |

(Continued)

OTHER PUBLICATIONS

Toru Takayama et al., "A CPU on a Plastic Film Substrate," 2004 Symposium on VLSI Technology Digest of Technical Papers, Jun. 15-17, 2004, pp. 230-231.
European Search Report dated Jan. 18, 2006 for Application No. 04024864.3.
European Search Report dated May 26, 2006 for Application No. 04024864.3.

*Primary Examiner*—Luan Thai
(74) *Attorney, Agent, or Firm*—Eric J. Robinson; Robinson Intellectual Property Law Office, P.C.

(57) ABSTRACT

It is an object of the invention to provide a peeling method which does not damage a peeling layer, and to perform peeling not only a peeling layer having a small-size area but also an entire peeling layer having a large-size area with a preferable yield. In the invention, after pasting a fixing substrate, a part of a glass substrate is removed by scribing or performing laser irradiation on the glass substrate which leads to providing a trigger. Then, peeling is performed with a preferable yield by performing peeling from the removed part. In addition, a crack is prevented by covering the entire face except for a connection portion of a terminal electrode (including a periphery region of the terminal electrode) with a resin.

20 Claims, 14 Drawing Sheets

U.S. PATENT DOCUMENTS

| | | | |
|---|---|---|---|
| 5,799,392 A | 9/1998 | Mishiro | |
| 5,821,138 A | 10/1998 | Yamazaki et al. | |
| 5,851,862 A | 12/1998 | Ohtani et al. | |
| 6,033,974 A | 3/2000 | Henley et al. | |
| 6,043,800 A | 3/2000 | Spitzer et al. | |
| 6,118,502 A | 9/2000 | Yamazaki et al. | |
| 6,127,199 A | 10/2000 | Inoue et al. | |
| 6,268,695 B1 | 7/2001 | Affinito | |
| 6,310,362 B1 | 10/2001 | Takemura | |
| 6,320,691 B1 | 11/2001 | Ouchi et al. | |
| 6,362,866 B1 | 3/2002 | Yamazaki et al. | |
| 6,372,608 B1 * | 4/2002 | Shimoda et al. | 438/455 |
| 6,376,333 B1 | 4/2002 | Yamazaki et al. | |
| 6,423,614 B1 | 7/2002 | Doyle | |
| 6,653,206 B2 | 11/2003 | Yanagita et al. | |
| 6,682,963 B2 | 1/2004 | Ishikawa | |
| 6,744,116 B1 | 6/2004 | Doyle | |
| 6,875,998 B2 | 4/2005 | Kato et al. | |
| 6,979,629 B2 | 12/2005 | Yanagita et al. | |
| 7,067,392 B2 * | 6/2006 | Yamazaki et al. | 438/455 |
| 2002/0025652 A1 | 2/2002 | Yanagita et al. | |
| 2002/0030189 A1 | 3/2002 | Ishikawa | |
| 2002/0146893 A1 * | 10/2002 | Shimoda et al. | 438/458 |
| 2003/0032210 A1 | 2/2003 | Takayama et al. | |
| 2003/0034497 A1 | 2/2003 | Yamazaki et al. | |
| 2003/0047280 A1 | 3/2003 | Takayama et al. | |
| 2003/0064569 A1 | 4/2003 | Takayama et al. | |
| 2003/0082889 A1 * | 5/2003 | Maruyama et al. | 438/455 |
| 2003/0183830 A1 | 10/2003 | Yamazaki et al. | |
| 2003/0183854 A1 | 10/2003 | Kato et al. | |
| 2004/0067621 A1 | 4/2004 | Yanagita et al. | |
| 2004/0239827 A1 | 12/2004 | Yamazaki et al. | |
| 2005/0023525 A1 | 2/2005 | Ishikawa | |
| 2005/0158936 A1 | 7/2005 | Kato et al. | |

FOREIGN PATENT DOCUMENTS

| | | |
|---|---|---|
| JP | 10-125930 | 5/1998 |
| JP | 10-125931 | 5/1998 |
| WO | WO 2004/064018 | 7/2004 |

* cited by examiner

Fig. 1A
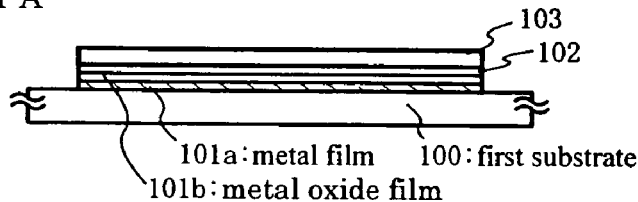
101a: metal film  100: first substrate
101b: metal oxide film
Fig. 1B
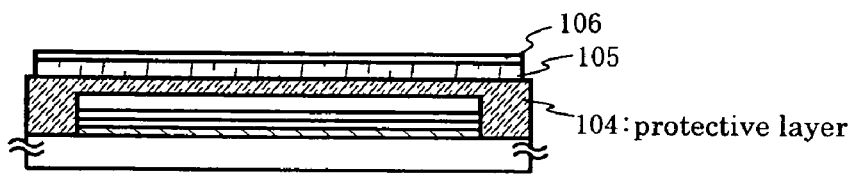
104: protective layer
Fig. 1C
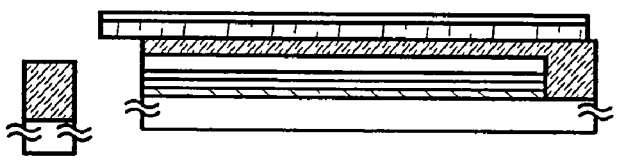
Fig. 1D
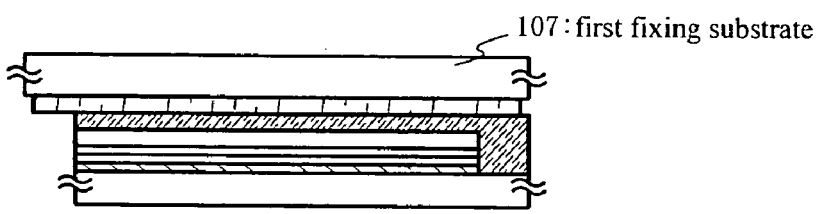
107: first fixing substrate
Fig. 1E
108
109: second fixing substrate
Fig. 1F
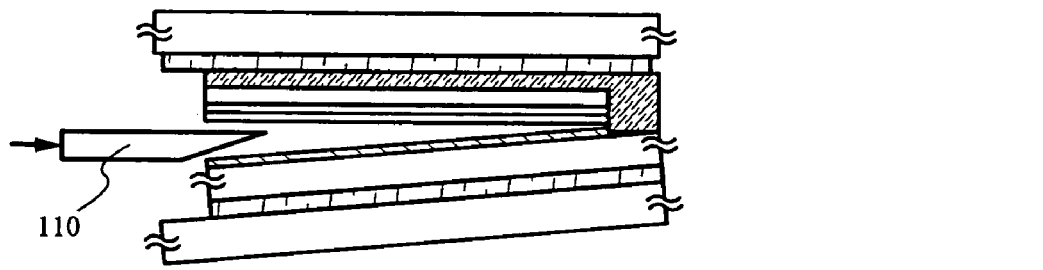
110

111   112:second substrate 113   114

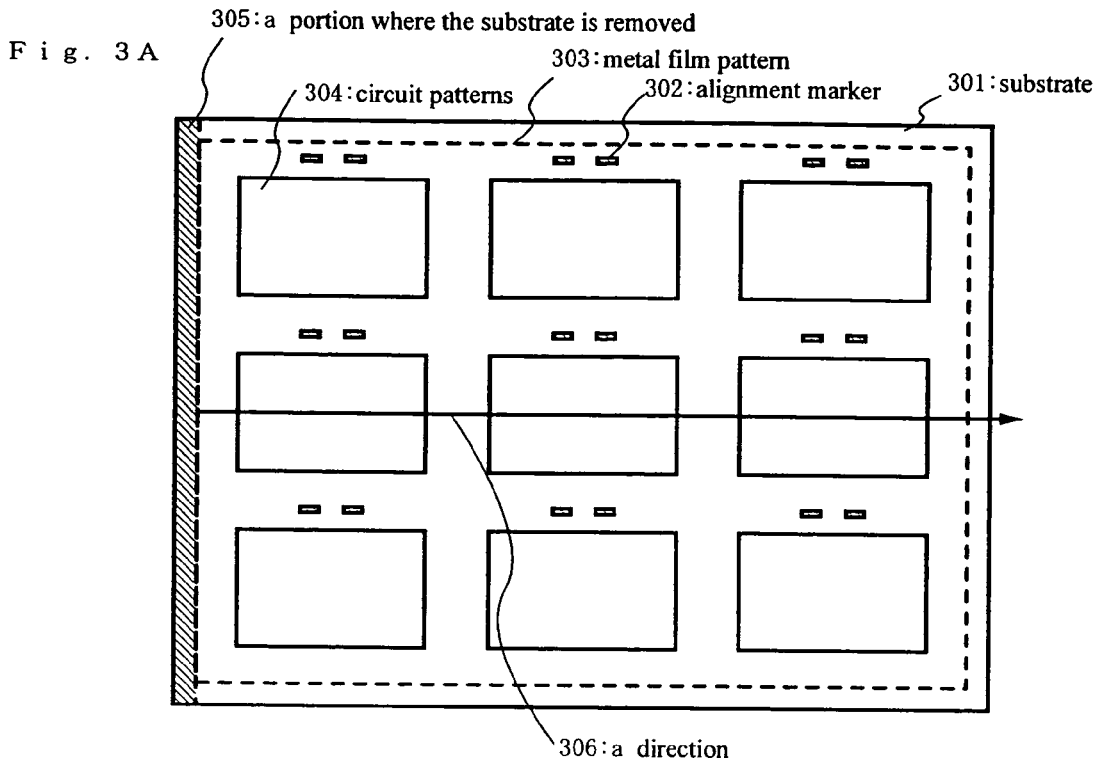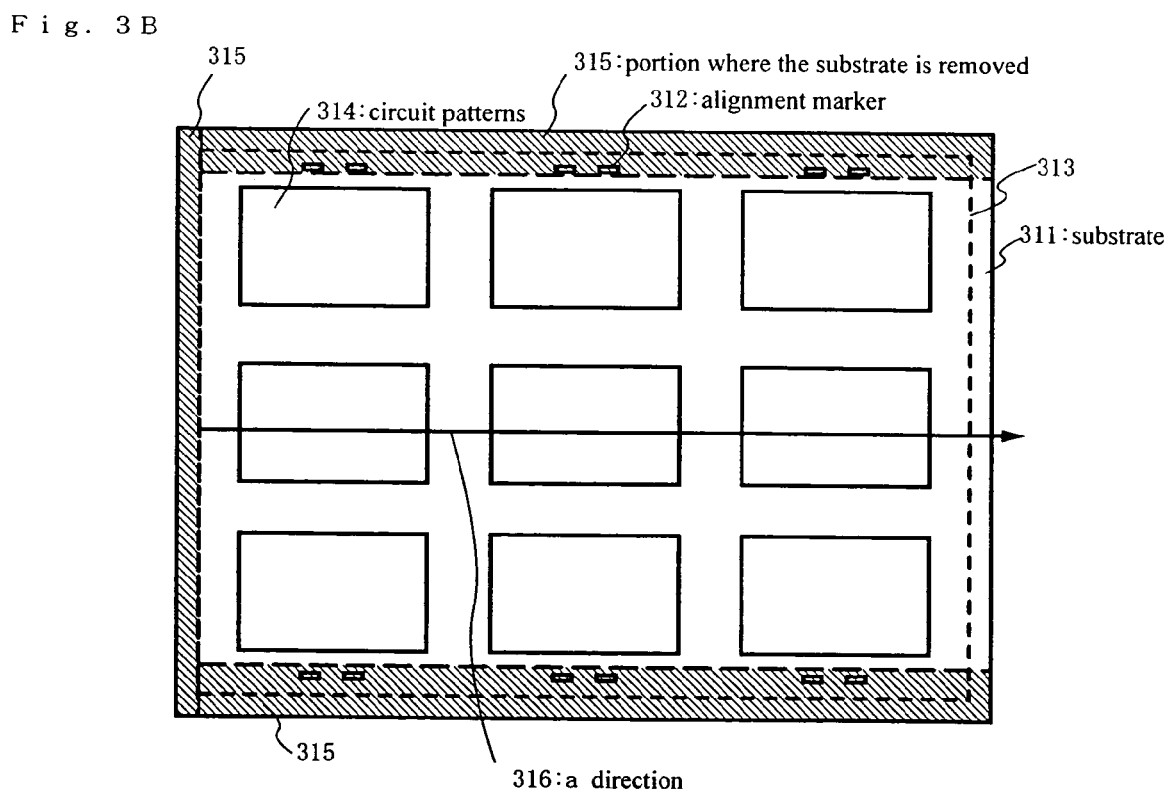

Fig. 13A
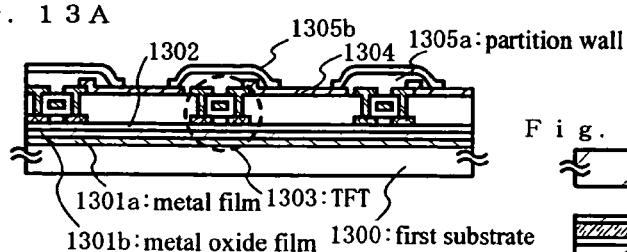
Fig. 13B
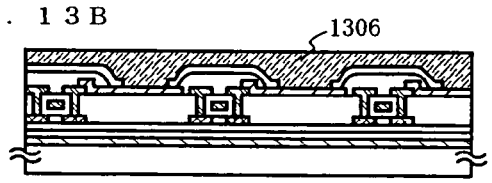
Fig. 13C
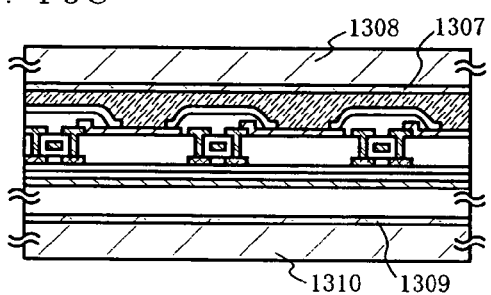
Fig. 13D
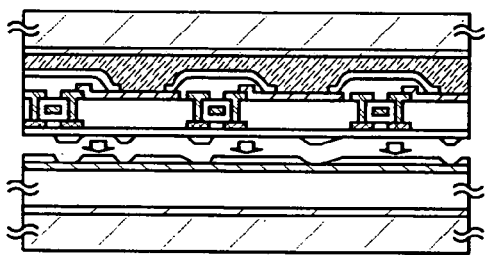
Fig. 13E
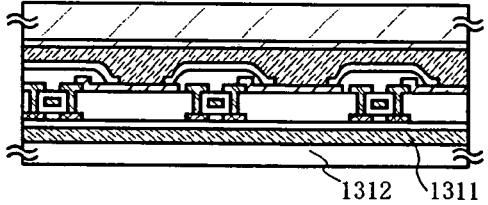
Fig. 13F
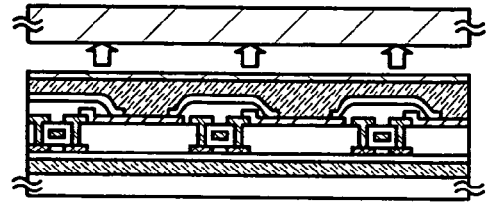
Fig. 13G
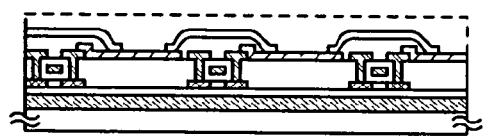
Fig. 13H
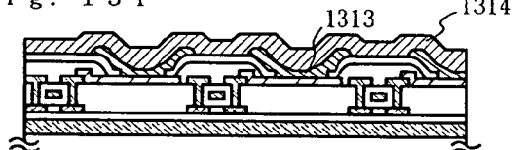
Fig. 13I
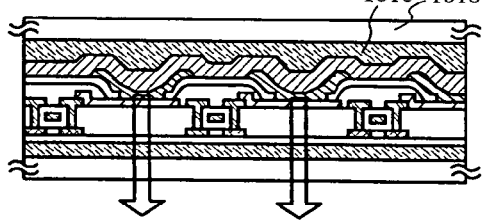
Fig. 13J

METHOD FOR MANUFACTURING SEMICONDUCTOR DEVICE

BACKGROUND OF THE INVENTION

1. Field of the Invention

The present invention relates to a semiconductor device having a circuit including a thin film transistor (hereinafter referred to as a TFT), and to a method for manufacturing the same. For example, the invention relates to an electronic device on which an electro-optical device typified by a liquid crystal display panel or a light emitting display device having an organic light emitting element is mounted as its component.

In this specification, the term "semiconductor device" refers to a device in general that utilizes semiconductor characteristics to function, and electro-optical devices, semiconductor circuits and electronic devices are all included in the semiconductor device.

2. Description of the Related Art

In recent years, a technique for forming a thin film transistor (a TFT) by using a semiconductor thin film (thickness is approximately from several nm to several hundreds nm) formed over a substrate having an insulating surface has drawn attention. The thin film transistor has gained a wide application in electronic devices such as an IC and an electro-optical device, and particularly, development of a TFT as a switching element for an image display device has been hurriedly carried out.

As for applications utilizing such an image display device, a variety of applications is expected. The utilization for a portable device has drawn attention, in particular. Although a glass substrate and a quartz substrate are widely utilized at present, there is a disadvantage of being easily cracked and heavy. Moreover, a glass substrate and a quartz substrate are difficult to be made larger on the basis of mass-production, and these are not suitable for that. Therefore, forming a TFT element over a substrate having flexibility, typically, over a flexible plastic film has been attempted.

However, since the heat resistance of a plastic film is low, it cannot help lowering the highest temperature of a process. As a result, a TFT which has not so excellent electric characteristics compared with those formed over a glass substrates is formed at present. Therefore, a liquid crystal display device and a light emitting element having a high performance using a plastic film have not been realized yet.

Moreover, a method for peeling a peeling layer existing over a substrate with a separation layer therebetween from the substrate has been already proposed. For example, techniques described in Japanese Patent Laid-Open No. Hei 10-125929 and Japanese Patent Laid-Open No. Hei 10-125931 are techniques that a separation layer including an amorphous silicon (or a polysilicon) is provided, laser light is radiated by being transmitted through the substrate, and makes hydrogen contained in the amorphous silicon released, thereby generating a space-gap to separate the substrate. In addition, there is also a description in Japanese Patent Laid-Open No. Hei 10-125930 that by utilizing this technique, a liquid crystal display device is completed by pasting a peeling layer (in the gazette, referred to as a transferring layer) to a plastic film.

However, in the above-mentioned method, it is essential to use a substrate having high light-transmitting properties, and for transmitting light through the substrate and further, for the purpose of giving sufficient energy for releasing hydrogen contained in the amorphous silicon, the irradiation of laser light having comparatively large energy to the entire surface is necessary. Consequently, there is a problem that the peeling layer is damaged. Moreover, in the above-mentioned method, in the case when an element is manufactured over a separation layer, if heat treatment at a high temperature or the like is performed in the process for manufacturing the element, hydrogen contained in the separation layer is dispersed and reduced. In that case, even if the laser light is radiated on the separation layer, there is a possibility that the peeling is not sufficiently performed. Therefore, in order to maintain the amount of hydrogen contained in the separation layer, a problem that the processes after the separation layer formation are limited occurs. Moreover, in the above-mentioned gazette, there is also a description that, a light-shielding layer or a reflection layer is provided in order to prevent a damage to the peeling layer. However, in this case, it is difficult to manufacture a transmissive type liquid crystal display device. In addition, by the above-mentioned method, it is difficult to peel a peeling layer having a large area.

Accordingly, the applicant proposes a peeling technique and a transferring technique described in Japanese Patent Laid-Open No. 2003-174153.

BRIEF SUMMARY OF THE INVENTION

It is an object of the present invention to provide a method for peeling without damaging a peeling layer, and to peel not only a peeling layer having a small area but also a peeling layer having a large area entirely with a preferable yield.

In the invention, when a metal layer is formed over a substrate and an oxide layer is laminated thereover, a metal oxide layer caused by the metal layer is formed at the interface between the metal layer and the oxide layer. A peeling method in which peeling is performed in a later step by using the metal oxide layer is used.

Specifically, a tungsten film (or an alloy film such as a tungsten nitride film) is formed over a glass substrate by sputtering, and a silicon oxide film is laminated by sputtering. When the silicon oxide film is formed by sputtering, a tungsten oxide layer in an amorphous state is formed. Then, the tungsten oxide layer is crystallized by forming an element such as a TFT over the silicon oxide film and by performing heat treatment of at least 400° C. in the element formation process. When physical force is applied, peeling occurs inside the tungsten oxide layer or at the interface. The peeling layer (including an element such as a TFT) peeled in this way is transferred to a plastic substrate.

It is significant to provide a trigger in order to make a peeling phenomenon easily occur before peeling. In view of this, by performing pretreatment which selectively (partially) weakens adhesion, a peeling defect disappears resulting in further improvement in the yield.

In the invention, after pasting a fixing substrate, a part of the glass substrate is removed by scribing or performing laser irradiation on the glass substrate, which leads to providing a trigger.

As laser light, a gas laser such as an excimer laser, a $CO_2$ laser, or an argon laser; a solid-state laser such as a glass laser, a ruby laser, an alexandrite laser, or Ti: sapphire laser; a solid-state laser using a crystal in which Nd, Tm and Ho are doped in a crystal such as YAG, $YVO_4$, YLF or $YAlO_3$; or a semiconductor laser may be used. The form of laser oscillation may be either continuous oscillation or pulse oscillation, and the shape of the laser beam may be any of a linear, rectangular, circular or elliptical shape. Moreover, the wavelength to be used may be any one of a fundamental wave, the second harmonic, or the third harmonic, and it can be appropriately selected by the practitioner. Further, the scanning method may be carried out in the vertical direction, the transverse direction, or diagonal direction and further, may be reciprocated.

One feature of the invention is that peeling is performed from a thus removed part. It is made easier to push a wedge for peeling between two fixing substrates being pasted each other, by removing a part of the glass substrate.

When a comparatively large substrate is used, gang printing is performed, which requires a plurality of alignment markers used for aligning a substrate or the like. An etching hole is used as an alignment marker. The etching hole is an opening having a glass substrate as its bottom surface and even an interlayer insulating film and a tungsten film are removed. However, the alignment markers sometimes cause a peeling defect. When a part where an alignment marker is provided and a circuit are aligned in the peeling direction, if a peeling defect occurs in the alignment marker part, the circuit which is in an extension of the peeling direction might be damaged.

Consequently, in the invention, alignment markers are arranged only in the circumference of a substrate, and the alignment markers are removed as a part of a glass substrate before peeling. It causes no problem even if the alignment markers are removed since the alignment markers are not necessary in a later step after a TFT is manufactured. In addition, peeling is performed in a direction where a plurality of alignment markers is arranged, since a peeling defect and the arrangement of alignment markers are related to each other. The location of the alignment markers and the arrangement of circuits are appropriately set in accordance with the direction in which peeling is performed.

When a device formed over a flexible film is mounted, a terminal electrode is conducted by pasting an FPC with pressure-bonding. In the pressure-bonding step, a crack is likely to occur since a wiring formed over the film (a wiring connected to the terminal electrode) is damaged. It is assumed that the crack is generated by deformation due to application of pressure since the film has flexibility. When the crack is large, there is a possibility to cause disconnection.

Therefore, one feature of the invention is to cover the entire face except for a connection portion of a terminal electrode (including a circumference of the terminal electrode) with a resin to prevent a crack from occurring.

A method for manufacturing a semiconductor device according to a configuration of the invention disclosed in this specification comprises the steps of: forming a peeling layer containing an element over a first substrate; applying an organic resin film which can be dissolved in a solvent over the peeling layer containing an element; pasting a first two-sided tape over the organic resin film; cutting off and removing a part of the first substrate; pasting a second substrate to the first two-sided tape; pasting a third substrate under the first substrate with a second two-sided tape; performing peeling to separate the first substrate, the second two-sided tape, and the third substrate from the peeling layer; pasting a fourth substrate to the peeling layer with an adhesive material.

A method for manufacturing a semiconductor device according to another configuration of the invention comprises the steps of: forming a peeling layer containing an element and an alignment marker over a first substrate; forming an organic resin film which can be dissolved in a solvent over the peeling layer containing an element; pasting a first two-sided tape over the organic resin film;cutting off and removing a part of the first substrate which is overlapped with the alignment marker; pasting a second substrate to the first two-sided tape; pasting a third substrate under the first substrate with a second two-sided tape ; performing peeling to separate the first substrate, the second two-sided tape, and the third substrate from the peeling layer; pasting a fourth substrate to the peeling layer with an adhesive material.

One feature of each above-mentioned configuration is that the second substrate and the third substrate have higher rigidity than that of the first substrate, and the fourth substrate is a film substrate.

In each of the above-mentioned configurations, peeling is performed by pasting the third substrate to the first substrate considering the case when the rigidity and the like are not enough when the first substrate is peeled. However, when the rigidity and the like are enough, it is unnecessary to paste the third substrate.

One feature of each above-mentioned configuration is that the peeling is performed from a part where the part of the first substrate is cut off and removed.

One feature of each above-mentioned configuration is that further comprising steps of: removing the second substrate; removing the first two-sided tape; and removing the organic resin film by dissolving with a solvent.

One feature of each above-mentioned configuration is that the element is a TFT element.

A method for manufacturing a semiconductor device according to another configuration of the invention comprises the steps of: forming a peeling layer containing an element over a first substrate; forming an organic resin film which dissolves in a solvent over the peeling layer containing an element; pasting a two-sided tape over the organic resin film;

cutting off and removing a part of the first substrate; pasting a second substrate to the two-sided tape; performing peeling from the part where a part of the first substrate is cut off and removed to separate the first substrate from the peeling layer containing an element; pasting a third substrate to the peeling layer containing an element with an adhesive material;

removing the second substrate; removing the two-sided tape; and removing the organic resin film by dissolving with a solvent.

One feature of the above-mentioned configuration is that the second substrate has higher rigidity than that of the first substrate, and the third substrate is a film substrate.

A method for manufacturing a semiconductor device according to another configuration of the invention comprises the steps of: forming a peeling layer containing an element and a terminal electrode over a first substrate; peeling the peeling layer containing an element and a terminal electrode from the first substrate; pasting a second substrate to the peeling layer containing an element and a terminal electrode with an adhesive material; and pressure-bonding an FPC to a terminal electrode in which a circumference is covered with a resin.

One feature of the above-mentioned configuration is that the first substrate is a glass substrate and the second substrate is a film substrate.

In each of the above-mentioned configurations, the step of peeling the peeling layer from the first substrate is not particularly limited, and a known method may be used. Above all, with the use of a peeling technique and a transferring technique described in Japanese Patent Laid-Open No. 2003-174153, a TFT having high mobility which can be obtained by heat treatment of 500° C. or more over a glass substrate can be transferred to a plastic substrate with a preferable yield. The peeling technique and the transferring technique described in Japanese Patent Laid-Open No. 2003-174153 are a peeling method in which a metal layer is formed over a substrate, a metal oxide layer of the metal layer is formed at the interface between the metal layer and an oxide layer when laminate the oxide layer over the metal layer, and peeling is performed in a later step with the use of the metal oxide layer.

Specifically, a tungsten film is formed by sputtering over a glass substrate, and a silicon oxide film is laminated by sputtering. A tungsten oxide layer in an amorphous state is formed when the silicon oxide film is formed by sputtering. Then, an element such as a TFT is formed over the silicon oxide film. The tungsten oxide layer is crystallized by performing heat treatment of 400° C. or more in the element formation process. When physical force is added, peeling occurs inside or at the interface of the tungsten oxide layer. The peeling layer peeled in this way (including an element such as a TFT) is transferred to a plastic substrate.

In each of the above-mentioned configurations, the peeling layer is a layer including a semiconductor integrated circuit having various elements typified by a TFT (a thin film diode; or a photoelectric transducer element, a silicon resistance element, or a sensor element (typically, a pressure-sensitive fingerprint sensor with the use of polysilicon) including a PIN junction of silicon). The peeling layer may be also called as a separation layer.

It is possible to apply the invention regardless of a TFT structure, and for example, it is possible to use a top gate type TFT, a bottom gate type (an inverse stagger type) TFT, or a forward stagger type TFT. In addition, the invention is not limited to a single gate structure TFT, and a multi-gate type TFT having a plurality of channel formation regions, for example, a double gate type TFT may be also used.

As an active layer of the TFT, an amorphous semiconductor film, a semiconductor film containing a crystal structure, a compound semiconductor film containing an amorphous structure can be appropriately used. Further, a semi-amorphous semiconductor film which is a semiconductor having an intermediate structure of an amorphous structure and a crystal structure (including single crystal and polycrystal), and a tertiary state which is stable energetically, and including a crystalline region having a short distance order and lattice distortion (also referred to as a microcrystal semiconductor film) can be used as the active layer of the TFT. In the semi-amorphous semiconductor film, a crystal grain having a grain diameter of from 0.5 nm to 20 nm is included in at least one region of the film, and in the Raman spectrum shifts to the lower side of wave number of 520 cm$^{-1}$. In addition, in the semi-amorphous semiconductor film, a diffraction peak of (111) and (220) derived from a Si crystal lattice is observed in x-ray diffraction. The semi-amorphous semiconductor film includes hydrogen or halogen of at least 1 atom % as a neutralizer of an uncombined hand (a dangling bond). The semi-amorphous semiconductor film is manufactured by performing glow discharging decomposition (plasma CVD) of a silicide gas. As the silicide gas, $SiH_4$, additionally, $Si_2H_6$, $SiH_2Cl_2$, $SiHCl_3$, $SiCl_4$, $SiF_4$, or the like can be used. The silicide gas may be diluted with $H_2$, or $H_2$ and one or more of rare gas elements: He, Ar, Kr, and Ne. Dilution ratio is within the range of from 2 times to 1000 times. Pressure is roughly within the range of from 0.1 Pa to 133 Pa; a power frequency, from 1 MHz to 120 MHz, preferably from 13 MHz to 60 MH; and a substrate heating temperature, at most 300° C., preferably from 100° C. to 250° C. An atmospheric constitution impurity such as oxygen, nitrogen or carbon as an impurity element within a film is preferably at most $1\times10^{20}$ cm$^{-3}$, in particular, oxygen concentration is at most $5\times10^{19}$ atoms/cm$^3$, preferably, at most $1\times10^{19}$ atoms/cm$^3$. Note that electric field-effect mobility μ of a TFT in using a semi-amorphous film as an active layer is from 1 cm$^2$/Vsec to 10 cm$^2$/Vsec.

According to the invention, peeling can be performed with a preferable yield on the entire face of a peeling layer having a large area.

BRIEF DESCRIPTION OF THE DRAWING

FIGS. 1A to 1F are cross-sectional views showing manufacturing steps of the invention (Embodiment Mode 1).

FIGS. 3A and 3B are top views showing peeling steps of the present invention (Embodiment Mode 1).

FIGS. 13A to 13J are diagrams showing manufacturing steps of a light emitting device (Embodiment 2).

DETAILED DESCRIPTION OF THE INVENTION

Figure 2A:
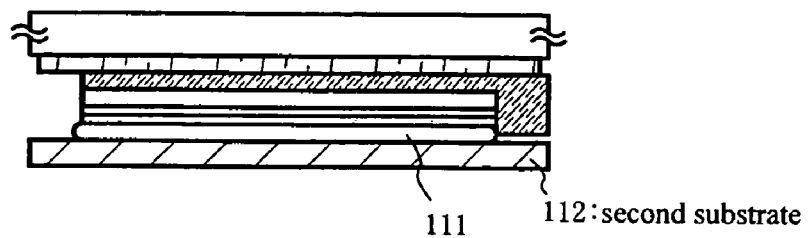
FIGS. 2A to 2E are cross-sectional views showing manufacturing steps of the invention (Embodiment Mode 1).

Embodiment modes of the present invention are described hereinafter.

Embodiment Mode 1

Here, a method for peeling with the use of a metal film and a silicon oxide film is used.

Initially, a peeling layer 103 which includes a semiconductor integrated circuit (here, a CPU), a terminal electrode (not shown), and an alignment marker (not shown) is formed over a first substrate 100.

A metal film 101*a*, here, a tungsten film (a film thickness of from 10 nm to 200 nm, preferably from 30 nm to 75 nm) is formed by sputtering, and an oxide film 102, here, a silicon oxide film (a film thickness of from 150 nm to 200 nm) is further laminated over the substrate without being exposed to the atmospheric air by sputtering. The film thickness of the oxide film 102 is desirably twice that of the metal film. At the time of laminating, a metal oxide film (a tungsten oxide film) in an amorphous state is formed with a thickness of from 2 nm to 5 nm between the metal film 101*a* and the silicon oxide film 102. In peeling in a later step, separation occurs inside the tungsten oxide film, at the interface between the tungsten oxide film and the silicon oxide film, or at the interface between the tungsten oxide film and the tungsten film.

The tungsten film, the tungsten oxide film and the silicon oxide film are formed also over an end face of the substrate with the use of sputtering; therefore, it is preferable to remove these films selectively by $O_2$ ashing or the like.

Subsequently, a silicon oxynitride film (a film thickness of 100 nm) (not shown) which serves as a base insulating film is formed by PCVD, and an amorphous silicon film containing hydrogen (a film thickness of 100 nm) is further laminated without being exposed to the atmospheric air.

Thereafter, the amorphous silicon film is crystallized by using a known technique (solid-phase growth, laser crystallization, crystallization using catalytic metal, or the like), and an element using a TFT having a polysilicon film as an active layer is formed. Here, the polysilicon film is obtained with crystallization using catalytic metal. A nickel acetate salt solution containing nickel of 10 ppm by weight is applied with a spinner. A nickel element can be sprayed over the entire surface by sputtering instead of spin coating. Then, heat treatment is carried out to crystallize the amorphous silicon film and to form a semiconductor film having a crystal structure (here, a polysilicon layer). In this embodiment mode, the silicon film having a crystal structure is obtained by performing heat treatment for crystallization (at 550° C. for 4 hours) after another heat treatment (at 500° C. for one hour).

Another crystallization method may be a method for obtaining a polysilicon film by irradiating a polysilicon film which is obtained by heating the amorphous silicon film after adding a metal element which serves as a catalyst, with continuous oscillation laser light; a method for obtaining a polysilicon film by irradiating the amorphous silicon film with continuous oscillation laser light; a method for obtaining a polysilicon film by irradiating a polysilicon film which is obtained by heating the amorphous silicon with continuous oscillation laser light; or a method for obtaining a polysilicon film by irradiating a polysilicon film which is obtained by heating the amorphous silicon film after adding a metal element which serves as a catalyst, with continuous oscillation laser light.

The amorphous silicon film contains hydrogen. In the case of forming a polysilicon film by heating, when heat treatment of 410° C. or more is performed for crystallization, hydrogen can be diffused as well as forming the polysilicon film. The metal oxide film in an amorphous state is crystallized by heat treatment of 410° C. or more; therefore, a metal oxide film 101b having a crystal structure can be obtained. Accordingly, the heat treatment of 410° C. or more makes it possible to form the metal oxide film having a crystal structure; therefore, hydrogen is diffused. After the heat treatment of 410° C. or more is finished, the separation inside of the tungsten oxide film, or at the interface between the tungsten oxide film and the silicon oxide film, or at the interface between the tungsten oxide film and the tungsten film can be achieved with relatively small force (for example, human hands, wind pressure of a gas blown from a nozzle, ultrasonic waves, or the like). Note that, when heat treatment is performed at a temperature at which the metal oxide film having a crystal structure can be obtained, the thickness thereof is thinned to some extent.

An oxide film on the surface of the silicon film having a crystal structure is removed with diluted hydrofluoric acid or the like. Then in order to enhance the crystallization rate and to repair a defect remaining in a crystal grain, the silicon film is irradiated with laser light (XeCl with the wavelength of 308 nm) in the atmospheric air or in an oxygen atmosphere.

A barrier layer formed of an oxide film formed by treating the surface with ozone water for 120 seconds in addition to the oxide film formed by the laser light irradiation, is formed with a thickness of from 1 nm to 5 nm in total. The barrier layer is formed to remove nickel which is added for crystallization from inside of the film. Before forming the barrier layer, the oxide film formed by laser light irradiation may be removed.

Over the barrier layer, an amorphous silicon film containing an argon element is formed to have a thickness of 10 nm to 400 nm, in this embodiment mode, 100 nm by sputtering or PCVD to serve as a gettering site.

Then, a furnace heated at 650° C. is used for heat treatment for 3 minutes for gettering to reduce the nickel concentration in the semiconductor film having a crystal structure. A lamp annealing apparatus may be substituted for the furnace.

Subsequently, the amorphous silicon film containing an argon element, which is the gettering site, is selectively removed by using the barrier layer as an etching stopper, and then, the barrier layer is selectively removed with diluted hydrofluoric acid. Note that there is a tendency that nickel is likely to move to a region having a high oxygen concentration in gettering, and thus, it is desirable that the barrier layer formed of the oxide film is removed after gettering.

In the case of not performing crystallization by using a catalytic element, the above-mentioned steps such as the formation of the barrier layer, the formation of the gettering site, the heat treatment for gettering, the removal of the gettering site, and the removal of the barrier layer are not necessary.

Then, after a thin oxide film is formed from ozone water on the surface of the obtained silicon film having a crystal structure (also referred to as a polysilicon film), a mask made from a resist is formed, and an etching treatment is conducted thereto to obtain a desired shape, thereby forming the island-like semiconductor layers separated from one another. After forming the semiconductor layers, the mask made from a resist is removed.

Subsequently, a gate insulating film which covers the semiconductor layer is formed. Then, a gate electrode is formed over the gate insulating film, and the formation of a source region or a drain region by doping to the semiconductor layer, the formation of an interlayer insulating film (an inorganic insulating film), the formation of a source electrode or a drain electrode, activation treatment, hydrogenation treatment, and the like are appropriately performed, thereby manufacturing a top gate type TFT in which the polysilicon film serves as the active layer. When phosphorus imparting n-type conductivity is added as an impurity element for doping, an n-channel TFT can be formed. On the other hand, when boron imparting p-type conductivity is added, a p-channel TFT can be formed. A CMOS circuit can be manufactured by combining these TFTs.

Here, an example of a top gate type is shown as a structure of the TFT. However, the structure of the TFT is not limited and for example, the structure may be a bottom gate type or a forward stagger type.

Various elements (a thin film diode; or a photoelectric transducer element, a silicon resistance element, or a sensor element (typically, a pressure-sensitive fingerprint sensor with the use of polysilicon) including a PIN junction of silicon) typified by a TFT can be formed by using thus obtained semiconductor layer including a polysilicon film.

In this way, a peeling layer 103 including a circuit having an element is formed (FIG. 1A).

In FIGS. 1A to 1F, the oxide film 102 and the peeling layer 103 are separately shown. However, when peeling is performed, the oxide film 102 can be included in one layer of the peeling layer, since the oxide film 102 and the peeling layer 103 are integrated. In addition, the oxide film 102 is also referred to as a layer for protecting the peeling layer.

Then, a protective layer 104 made of an adhesive material which is soluble in water or alcohols is applied to the entire surface, and baked. The adhesive material may have any composition of, for example, epoxy series, acrylate series, silicon series, or the like. Here, a protective layer made from a water-soluble resin (manufactured by TOAGOSEI Co., Ltd.: VL-WSHL10) is applied by spin coating to have a film thickness of 30 μm, and is cured. The water-soluble resin film functions as a planarizing film, which thereafter bonds a substrate so that a surface of the planarizing film and the surface of the substrate are placed in parallel. In pressure-bonding, unevenness might occur due to an electrode or a TFT when the water-soluble resin film is not used.

Thereafter, a first two-sided tape 105 is pasted to the protective layer 104 (FIG. 1B). It is preferable to paste the first two-sided tape 105 under the reduced pressure in order to prevent a bubble from entering a bonding face. Reference numeral 106 denotes a protective sheet of the two-sided tape 105, and the other bonding face of the two-sided tape can be exposed by peeling the protective sheet in a later step.

Then, treatment to partially weakens adhesion of the metal film 101 to the oxide film 102 is performed to make later peeling treatment easier, and treatment to remove a part of the substrate is further performed. The treatment to partially weaken adhesion is treatment to damage inside or a part of the interface of the oxide film 102 by locally applying pressure from the outside along the periphery of a region to be peeled. For example, a scriber device which is moved by applying pressure with a press force ranging from 0.1 mm to 2 mm may be used. Afterwards, a part of the substrate is removed along a scribe line (FIG. 1C).

Here, an example of a top view of the substrate is shown in FIG. 3A. FIG. 3A is an example in which nine CPUs are formed over one substrate, and reference numeral 301 denotes a substrate; 302, alignment markers; 303, a metal film pattern; 304, circuit patterns; and 305, a portion where the substrate is removed. The alignment markers 302 are formed by etching the metal film pattern. Later peeling treatment is made easier by removing one side of the substrate as shown in FIG. 3A.

Then, a first fixing substrate 107 is pasted by peeling the protective sheet 106 (FIG. 1D). It is preferable to paste the first fixing substrate 107 under the reduced pressure in order to prevent a bubble from entering a bonding face.

Then, a second fixing substrate 109 is pasted by a second two-sided tape 108 (FIG. 1E). It is preferable to paste the second fixing substrate 109 under the reduced pressure in order to prevent a bubble from entering a bounding face. Note that the second fixing substrate 109 may not be pasted since it is pasted to protect the substrate 100 from being cracked in later peeling treatment.

Subsequently, the first substrate 100 provided with the metal film 101a is peeled with a physical means. The substrate can be peeled with relatively small force (for example, human hands, wind pressure of a gas blown from a nozzle, ultrasonic waves, or the like). Here, peeling is conducted by pushing a wedge 110 in the part where a part of the substrate is removed. In this way, the peeling layer formed over the silicon oxide layer 102 can be separated from the first substrate 100. FIG. 1F shows a state after peeling.

Incidentally, a direction 306 shown in FIG. 3A is desirably a direction for peeling from the part where a part of the substrate is removed. A circuit pattern 304 is not damaged even if a peeling defect is generated due to the alignment markers 302 since the circuit pattern is not arranged in an extension of the peeling direction.

In order to eliminate a peeling defect due to the alignment marker, the alignment markers may be arranged as shown in FIG. 3B, and a part of the substrate where the alignment markers 312 are arranged may be further removed before peeling in removing a part of the substrate. In FIG. 3B, three sides of the substrate are removed before peeling. In FIG. 3B, reference numeral 311 denotes a substrate; 312, alignment markers; 313, a metal film pattern; 314, circuit patterns; 315, a portion where the substrate is removed; and 316, a peeling direction.

The alignment markers in FIGS. 3A and 3B are openings which reach the substrate formed by etching the metal film pattern. When alignment markers are formed to be openings which reach the oxide film, a peeling defect due to the alignment markers can be prevented since the metal pattern is not etched.

Then, a second substrate 112 formed of a plastic film is bonded on the side of the oxide film 102 with an adhesive material 111 (FIG. 2A). It is preferable to paste the second substrate 112 also under the reduced pressure in order to prevent a bubble from entering a bonding face. As the adhesive material 111, various kinds of curable adhesives such as a reaction-cured adhesive, a thermo-setting adhesive, a photo-curable adhesive such as a UV-curable adhesive, an anaerobic adhesive can be used. As a material for the second substrate 112, a synthetic resin including polypropylene, polypropylene sulfide, polycarbonate, polyetherimide, polyphenylene sulfide, polyphenylene oxide, poly sulfone or polyphtalamide can be used. An HT substrate with Tg of 400° C. or more (manufactured by Nippon Steel Chemical Co., Ltd.) may be also used.

Figure 2B:
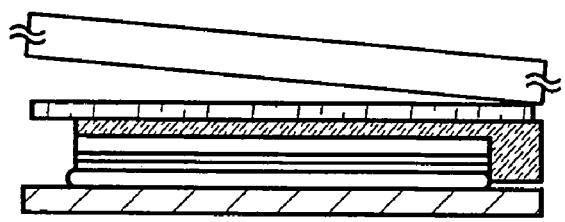
Figure 2C:
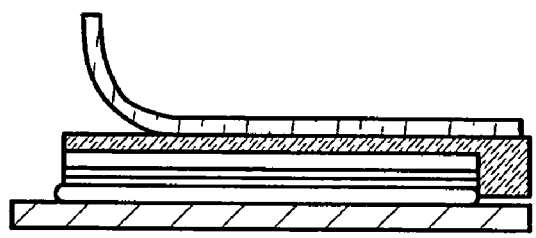

Subsequently, the first fixing substrate is separated from the first two-sided tape (FIG. 2B). The first two-sided tape is then peeled (FIG. 2C).

Figure 2D:
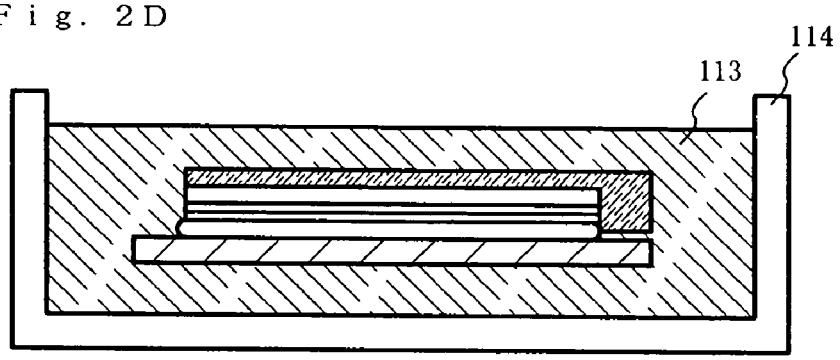

The resin layer formed of the water-soluble resin is dissolved and removed by soaking in a solvent 113, here, water in a container 114 (FIG. 2D).

Figure 2E:
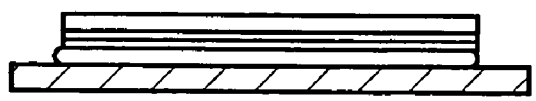

Through the above-mentioned steps, the peeling layer provided over the first substrate can be transferred to the second substrate 112 formed of the plastic film with a preferable yield (FIG. 2E).

Moreover, another element may be formed over the transferred peeling layer. For example, an anode, a layer containing an organic compound, a light emitting element having a cathode, a Schottky-type diode (a light sensor) in which a photoelectric transducer layer is sandwiched between an anode electrode and a cathode electrode may be formed.

When gang printing is performed as shown in FIGS. 3A and 3B, each circuit pattern may be appropriately divided. A cutting process can be performed comparatively easily compared with a glass substrate or a quartz substrate since it is cutting of a film substrate. When gang printing is performed on a glass substrate or a quartz substrate, a crack or a chip is likely to occur with the use of a scriber device or a breaker device for cutting. Therefore, the smaller a circuit becomes, the more difficult a cutting process becomes. A cutting process can be easily performed even if a circuit is small with laser processing, a cutter, or the like since a film substrate is used in the invention. Hence, a large number of minute devices can be manufactured from a large-sized substrate with a preferable yield.

Embodiment Mode 2

Figure 4A:
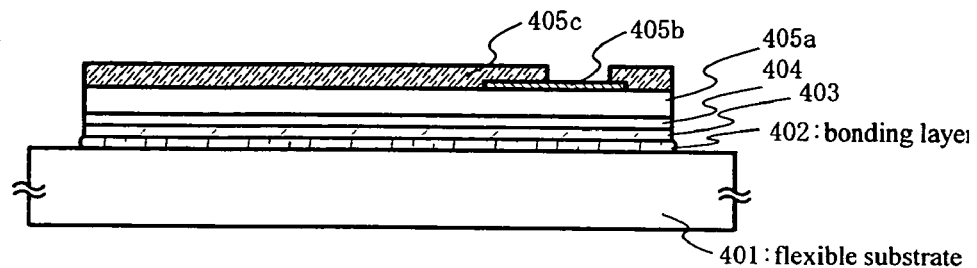
FIGS. 4A to 4C are cross-sectional views and a top view showing manufacturing steps of the invention (Embodiment Mode 2).
Figure 4B:
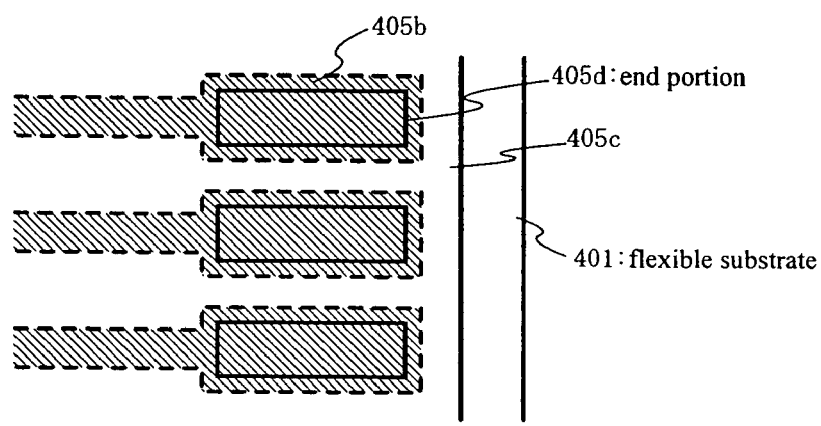
Figure 4C:
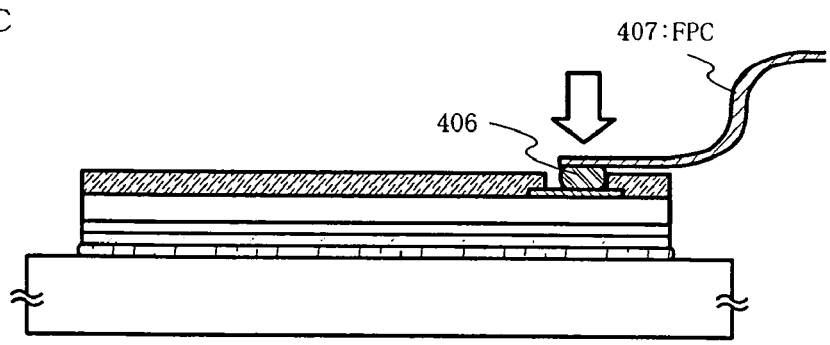

Here, when an FPC is pressure-bonded to a device which is transferred to a flexible substrate such as a plastic film, a method for preventing a defect such as a crack and the like is shown with reference to FIGS. 4A to 4C.

Initially, a peeling layer formed over a glass substrate is transferred to a flexible substrate according to Embodiment Mode 1. After forming a metal film over the glass substrate, at the time of forming an oxide film 404, a metal oxide film in an amorphous state is formed between the metal film and the oxide film. The peeling layer is then formed over the oxide film 404.

As the peeling layer to be transferred, a layer 405a including a circuit having an element 405a, and a terminal electrode 405b are formed, and a protective layer 405c formed from a resin to prevent a crack is formed thereover.

The metal oxide film becomes a crystallized metal oxide film 403 by performing heat treatment of 400° C. or more in a process to form the peeling layer.

According to Embodiment Mode 1, the glass substrate with the metal film formed thereover is removed by separating at the interface between the metal oxide film 403 and the metal film, and the surface of the metal oxide film 403 is pasted to a flexible substrate 401 with a bonding layer 402. FIG. 4A shows a cross-sectional view showing the above-mentioned state and FIG. 4B shows a top view.

The terminal electrode 405b is protected by being covered its circumference with the resin 405c. That is only a part of the electrode face which is connected to an FPC is in an exposed state as FIG. 4B shows an end portion 405d of the resin.

Then, the electrode is connected by an aerotropic conductive film 406 by applying pressure on the FPC 407 to bond (FIG. 4C). In the pressure-bounding step, a crack caused by deformation due to application of pressure can be prevented, since a wiring (a wiring connected to the terminal electrode) is protected by the resin 405c.

In this specification, the aerotropic conductive film 406 means a thermo-setting resin film or a thermoplastic resin film in which a conductive particle is mixed, and is also referred to as an ACF (anisotropic Conductive Film). The ACF may be either a two-layer ACF or a three-layer ACF. The FPC 407 is a film in which a wiring is provided over an insulating film and then laminated.

This embodiment mode can be freely combined with Embodiment Mode 1.

The following Embodiment describes the present invention formed of the above-mentioned structure in further detail.

Embodiment 1

Figure 5A:
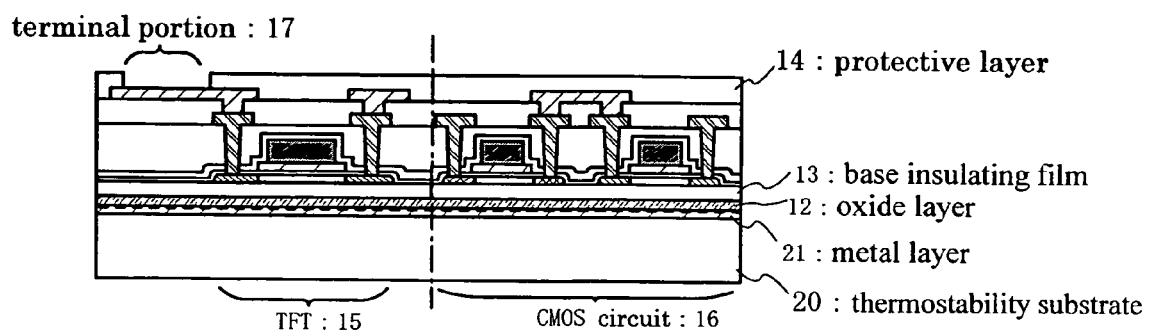
FIGS. 5A and 5B are cross-sectional views showing Embodiment 1.
Figure 5B:
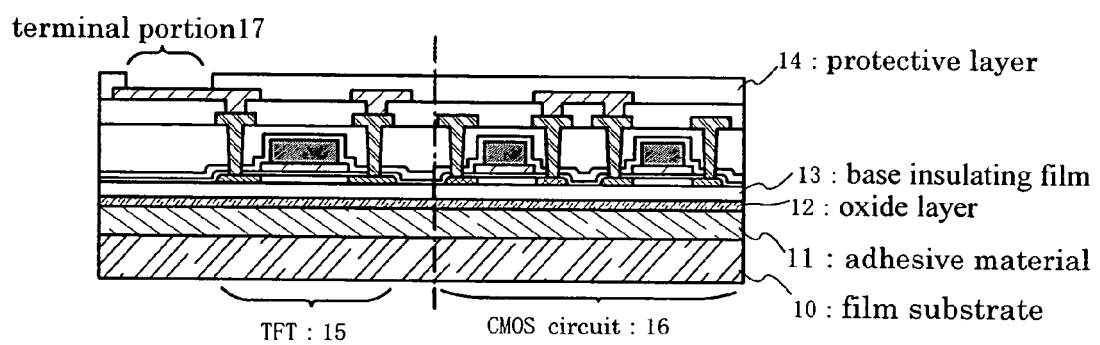

In this embodiment, an example of transferring a semiconductor integrated circuit, typically, a CPU to a plastic substrate is shown. FIG. 5A shows a cross-sectional view before transferring, and FIG. 5B shows a cross-sectional view after transferring.

Initially, a metal layer 21 is formed over a thermostability substrate 20 such as a quartz substrate or a glass substrate. In this embodiment, Corning 1737 (or EAGLE 2000) of 5 inches manufactured by Corning Incorporated is used as a glass substrate.

As a material forming the metal layer 21, an element of tungsten (W), molybdenum (Mo), technetium (Tc), rhenium (Re), ruthenium (Ru), osmium (Os), rhodium (Rh), iridium (Ir), palladium (Pd), and silver (Ag), an alloy containing the element as its main component, or a monolayer or lamination layer of nitride (for example, titanium nitride, tungsten nitride, tantalum nitride, or molybdenum nitride) can be used.

In this embodiment, the metal film 21, here, a tungsten film is formed by sputtering (under the deposition condition in which membrane stress is small: a flow of Ar, 100 sccm; a deposition pressure, 2 Pa; a deposition power, 4 kW; a substrate temperature, 200° C.; and a film thickness, from 10 nm to 200 nm, preferably, from 50 nm to 75 nm) over the glass substrate. Then, an oxide layer 12, here, a silicon oxide film (a film thickness of from 150 nm to 200 nm) is further laminated by sputtering without being exposed to the atmospheric air. The film thickness of the oxide layer 12 is desirably twice or more of that of the metal layer. At the time of laminating, a metal oxide film (a tungsten oxide film) in an amorphous state is formed with a thickness of from 2 nm to 5 nm between the metal layer and the silicon oxide film. The metal oxide film in an amorphous state is shown by a dotted line in FIG. 5A. In peeling in a later step, peeling occurs inside the tungsten oxide film, at the interface between the tungsten oxide film and the silicon oxide film, or at the interface between the tungsten oxide film and the tungsten film. The tungsten oxide film remains on the surface of the oxide layer 12 after peeling, and it may be removed.

The tungsten film, the tungsten oxide film and the silicon oxide film are formed also over an end face of the substrate with the use of sputtering; therefore, it is preferable to selectively remove these films by dry etching, $O_2$ ashing or the like.

Then, a silicon oxynitride film (a film thickness of 100 nm) which serves as a base insulating film 13 is formed by PCVD, and an amorphous silicon film containing hydrogen (a film thickness of 150 nm) is further laminated without being exposed to the atmospheric air. Note that the silicon oxynitride film is a blocking layer which prevents an impurity such as alkali metal from being diffused from the glass substrate. In this embodiment, a film thickness of the semiconductor film is made to be relatively thick, since continuous oscillation laser light is radiated in a later step.

Thereafter, the above-mentioned amorphous silicon film is crystallized by using a known technique (solid-phase growth, laser crystallization, crystallization using catalytic metal, or the like), and an element using a TFT having a polysilicon film as an active layer is formed. Here, the polysilicon film is obtained with crystallization using catalytic metal. A nickel acetate salt solution containing nickel of 10 ppm by weight is applied with a spinner. A nickel element may be sprayed over the entire surface by sputtering instead of spin coating. Then, heat treatment is carried out to crystallize the amorphous silicon film and to form a semiconductor film having a crystal structure (here, a polysilicon layer). In this embodiment, the silicon film having a crystal structure is obtained by performing heat treatment for crystallization (at 550° C. for 4 hours) after another heat treatment (at 550° C. for one hour).

The amorphous silicon film contains hydrogen. In the case of forming a polysilicon film by heating, when heat treatment of 410° C. or more is performed for crystallization, hydrogen can be diffused as well as forming the polysilicon film. The metal oxide film in an amorphous state is crystallized by heat treatment of 410° C. or more; therefore, a metal oxide film having a crystal structure can be obtained. Accordingly, the heat treatment of 410° C. or more makes it possible to form the metal oxide film having a crystal structure; therefore, hydrogen is diffused. After the heat treatment of 410° C. or more is finished, the separation inside of the tungsten oxide film, or at the interface between the tungsten oxide film and the silicon oxide film, or at the interface between the tungsten oxide film and the tungsten film can be achieved with relatively small force (for example, human hands, wind pressure of a gas blown from a nozzle, ultrasonic waves, or the like). Note that, when heat treatment is performed at a temperature at which the metal oxide film having a crystal structure can be obtained, the thickness thereof is thinned to some extent as well as a change in a composition of the metal oxide film. Further, the tungsten oxide film having a crystal structure has a plurality of crystal structures ($WO_2$, $WO_3$, $WO_x$ ($2<X<3$)), and $WO_3$ is changed into $WO_2$, or $WO_x$ depending on the heat treatment in its composition.

Then, after removing an oxide film on the surface of the silicon film having a crystal structure with diluted hydrofluoric acid or the like, continuous oscillation laser light is radiated. It is preferable that the second harmonic through the fourth harmonic of fundamental waves is applied by using a solid-state laser which is capable of continuous oscillation in order to obtain a crystal in a large grain size. Typically, it is preferable that the second harmonic (wavelength: 532 nm) or the third harmonic (wavelength: 355 nm) of an Nd: $YVO_4$ laser (fundamental wave length: 1064 nm) may be applied. When continuous-wave laser is used, laser light emitted from the continuous oscillation $YVO_4$ laser with 10 W output is converted into a harmonic by using a non-linear optical element. Also, a method of emitting a harmonic by applying a crystal of $YVO_4$ and a non-linear optical element into a resonator. Then, preferably, the laser light is formed to have a rectangular shape or an elliptical shape on an irradiation face by an optical system, thereby irradiating a substance to be treated. At this time, the energy density of approximately from 0.01 $MW/cm^2$ to 100 $MW/cm^2$ (preferably from 0.1 $MW/cm^2$ to 10 $MW/cm^2$) is required. The semiconductor film may be irradiated by being moved relatively to laser light with a rate of approximately from 10 cm/s to 2000 cm/s.f A barrier layer formed of an oxide film formed by treating the surface with ozone water for 120 seconds in addition to the oxide film formed by the laser light irradiation, is formed with a thickness of from 1 nm to 5 nm in total. The barrier layer is formed to remove nickel which is added for crystallization from inside of the film. Though the barrier layer is formed by using ozone water here, other methods such as ultraviolet irradiation under the oxygen atmosphere or oxygen plasma treatment to oxidize the surface of the semiconductor film having a crystal structure may be used. In addition, other method for forming the barrier layer, an oxide film having a thickness of approximately from 1 nm to 10 nm may be deposited by plasma CVD, sputtering, evaporation, or the like. Note that before forming the barrier layer, the oxide film formed by laser light irradiation may on the surface be removed.

Over the barrier layer, an amorphous silicon film containing an argon element is formed to have a thickness of from 10 nm to 400 nm, in this embodiment, 50 nm by sputtering to serve as a gettering site. In this embodiment, the amorphous silicon film containing argon is formed under an atmosphere containing argon by using a silicon target. When plasma CVD is used for forming the amorphous silicon film containing an argon element, it is formed under the deposition condition where a flow ratio of monosilane to argon ($SiH_4$ to Ar) is 1/99; a pressure during deposition, 6.665 Pa (0.05 Torr); an RF power density, 0.087 $W/cm^2$; and a deposition temperature, 350° C.

Then, a furnace heated at 550° C. is used for heat treatment for 4 hours for gettering to reduce the nickel concentration in the semiconductor film having a crystal structure. A lamp annealing apparatus may be used instead of the furnace Subsequently, the amorphous silicon film containing an argon element, which is the gettering site, is selectively removed by using the barrier layer as an etching stopper, and then, the barrier layer is selectively removed with diluted hydrofluoric acid. Note that there is a tendency that nickel is likely to move to a region having a high oxygen concentration in gettering, and thus, it is desirable that the barrier layer formed of the oxide film is removed after gettering.

Then, after a thin oxide film is formed from ozone water on the surface of the obtained silicon film having a crystal structure (also referred to as a polysilicon film), a mask made from a resist is formed with the use of a first photomask, and etching treatment is conducted thereto to obtain a desired shape, thereby forming island-like semiconductor layers separated from one another. After forming the semiconductor layers, the mask made from a resist is removed.

Then, doping of a small amount of impurity element (boron or phosphorus) is performed in order to control the threshold value of the TFT, if necessary. Here, ion doping in which plasma is excited is used without performing mass separation on diborane ($B_2H_6$).

Next, the oxide film is removed with an etchant containing hydrofluoric acid, and at the same time, the surface of the silicon film is washed. Thereafter, an insulating film containing silicon as its main component, which serves as a gate insulating film, is formed. In this embodiment, a silicon oxynitride film (composition ratio: Si=32%, O=59%, N=7%, H=2%) is formed to have a thickness of 115 nm by plasma CVD.

Then, after forming a metal film over the gate insulating film, patterning is performed with the use of a second photomask, thereby forming a gate electrode (or gate wiring) and a terminal electrode. Then, a source region or a drain region of a TFT is formed by doping into an activated layer.

Then, after a first interlayer insulating film formed of a silicon oxide film is formed to have a thickness of 50 nm by CVD, a step of treatment for activating the impurity elements added into each semiconductor layer is performed. The activation step is performed by rapid thermal annealing with the use of a lamp light source (RTA), a method for radiating a YAG laser or an excimer laser from a back side, heat treatment using a furnace, or a method in which any of the steps are combined.

Then, a second interlayer insulating film formed of a silicon nitride oxide film containing hydrogen is formed, and heat treatment (for from 1 hour to 12 hours at temperatures from 300° C. to 550° C.) is performed to conduct a step of hydrogenating the semiconductor layer. This step is a step of terminating a dangling bond by hydrogen contained in the first insulating film. The semiconductor layer can be hydrogenated regardless of the interlayer insulating film formed of the silicon oxide film.

Then, a third interlayer insulating film including an organic insulation material is formed over the second interlayer insulating film. Here, an acrylic resin film with a film thickness of 0.8 μm is formed.

A fourth interlayer insulating film formed of an inorganic insulating film having a film thickness of from 250 nm to 350 nm is formed over the third interlayer insulating film by sputtering.

Then, a mask made from a resist is formed with the use of a third photomask, and a contact hole is formed by selectively etching the interlayer insulating film or the gate insulating film. Thereafter, the mask formed from a resist is removed.

Subsequently, a mask formed from a resist is formed with the use of a fourth photomask after laminating a metal film, and a source electrode or a drain electrode of a TFT is formed by selectively etching the metal laminated film. Then, the mask formed from a resist is removed. In addition, the metal laminated film is a three-layer lamination of a Ti film with a film thickness of 100 nm, an Al film which contains a small amount of Si with a film thickness of 350 nm, and a Ti film with a film thickness of 100 nm.

Through the above-mentioned steps, a top gate type TFT 15 which uses the polysilicon film as the active layer can be manufactured.

Then, a fifth interlayer insulating film made of a an inorganic insulating film or an organic resin is formed. After a contact hole is formed by etching the fifth interlayer insulating film, a connection wiring or a terminal electrode made from a metal material is formed. A CMOS circuit 16 in which a p-channel TFT and an n-channel TFT are combined is manufactured by forming the connection wiring.

Incidentally, as each interlayer insulating film (the first interlayer insulating film to the fifth interlayer insulating film), an inorganic material (silicon oxide, silicon nitride, silicon oxynitride or the like), a photosensitive or non-photosensitive organic material (polyimide, acrylic, polyamide, polyimidamide, resist or benzocyclobutene), an SOG film obtained by spin coating (for example, an SiOx film containing an alkyl group), or a lamination thereof can be used.

Then, a protective layer 14 is formed, and only a terminal portion 17 is exposed by selectively etching the protective layer 14. The protective layer 14 is provided to prevent a crack due to pressure-bonding in mounting an FPC. FIG. 5A shows a cross-sectional view after the above-mentioned steps.

As the protective layer 14, a photosensitive or non-photosensitive organic material (polyimide, acrylic, polyamide, polyimidamide, resist or benzocyclobutene), an SOG film obtained by spin coating (for example, an SiOx film containing an alkyl group in which a siloxane application film is used, or an SiOx film in which a polysilazane application film is used), or a lamination thereof can be used.

Then, an adhesive material which is soluble in water or alcohols is applied to the entire surface, and baked. The adhesive material may have any composition of, for example, epoxy series, acrylate series, silicon series, or the like. Here, a film made from a water-soluble resin (manufactured by TOAGOSEI Co., Ltd.: VL-WSHL10) is applied by spin coating to have a film thickness of 30 μm, and is exposed for two minutes to be temporarily cured, then, exposed its back to UV rays for 2.5 minutes, and its surface for 10 minutes to be fully cured. The water-soluble resin film serves as a planarizing film, which thereafter bonds a substrate so that a surface of the planarizing film and the surface of the substrate are placed in parallel. Unevenness might occur due to an electrode or a TFT when the water-soluble resin film is not used in pressure-bonding a first fixing substrate.

Then, a first two-sided tape is pasted to an adhesive material.

Treatment of partially weakening the adhesion between the metal layer and the metal oxide film, or the metal oxide film and the oxide film is performed for easy separation. The treatment for partially wakening the adhesion is carried out by using a scriber device which is moved with applying pressure with a press force ranging from 0.1 mm to 2 mm. Then, a part of the glass substrate may be cut off with a breaker device.

Then, the first fixing substrate made of a quartz substrate is fixed to the first two-sided tape. Next, a second fixing substrate is fixed under the glass substrate with a second two-sided tape.

Then, peeling is performed from a side where a part of the glass substrate is removed, and the glass substrate 20 over which the metal layer 21 is provided is peeled with a physical means. The glass substrate 20 can be peeled with relatively small force (for example, human hands, wind pressure of a gas blown from a nozzle, ultrasonic waves, or the like). Thus, the peeling layer formed over the oxide layer can be separated from the glass substrate 20.

After peeling, one third of $WO_3$ remains over the glass substrate and the two thirds remains over the side of the peeling layer. Peeling is likely to occur inside the tungsten oxide film, especially, at the interface between $WO_2$ and WOx, or at the interface between $WO_2$ and $WO_3$. Although the tungsten oxide film partially remains over the side of the peeling layer, it is not matter if the tungsten oxide film is removed or not removed since the film is transparent.

Then, a film substrate 10 and the oxide layer 12 (and the peeling layer) are bonded together with an adhesive material 11. It is important that adhesion between the first fixing substrate and the peeling layer by the first two-sided tape is higher than that of between the oxide layer 12 (and the peeling layer) and the film substrate 10.

Then, the first fixing substrate is separated from the first two-sided tape. Next, the two-sided tape is peeled. Further, the water-soluble resin is dissolved and removed with the use of water.

Through the above-mentioned steps, the TFT 15 and the CMOS circuit 16 which are transferred to the film substrate 10 can be formed (FIG. 5B). In this embodiment, a CPU is designed with the use of these elements.

Figure 6:
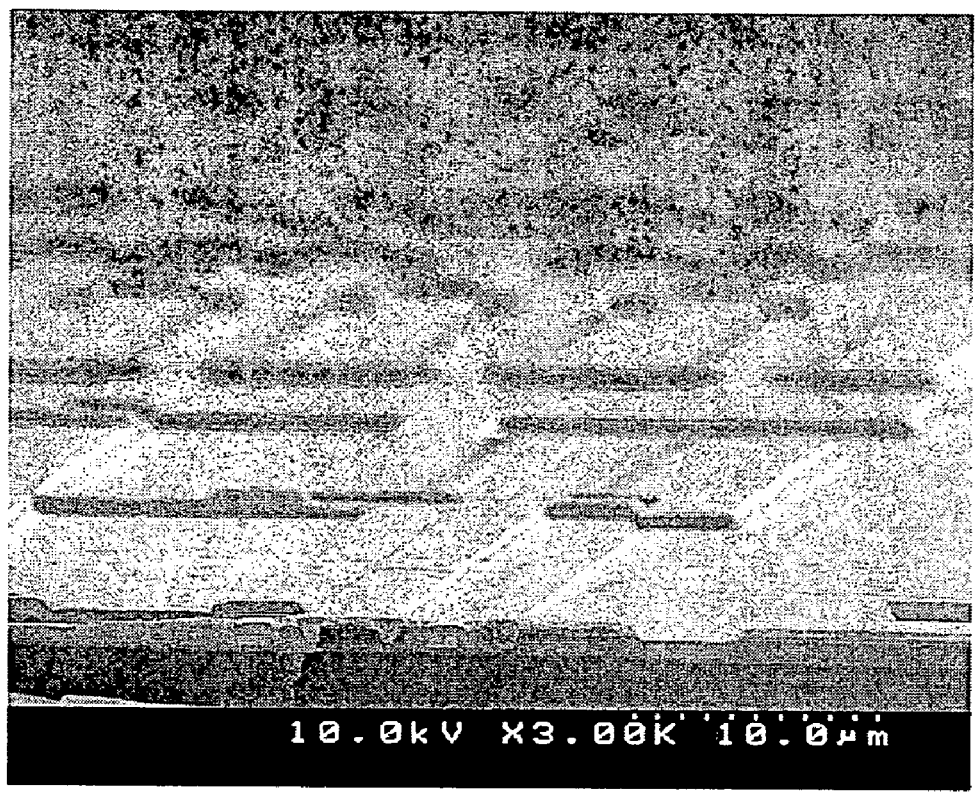
FIG. 6 is a photograph of a surface and a cross-section after transferring (Embodiment 1).
Figure 7:
FIG. 7 is an SEM picture of a cross-section of a TFT (Embodiment 1).

Cross-sectional photographs of a TFT which is actually transferred to a film substrate taken by a SEM is shown in FIGS. 6 and 7. FIG. 7 is an enlarged view of FIG. 6. A TFT having a single drain structure with a gate length of 1.2 μm can be confirmed with reference to FIG. 7.

Figure 8:
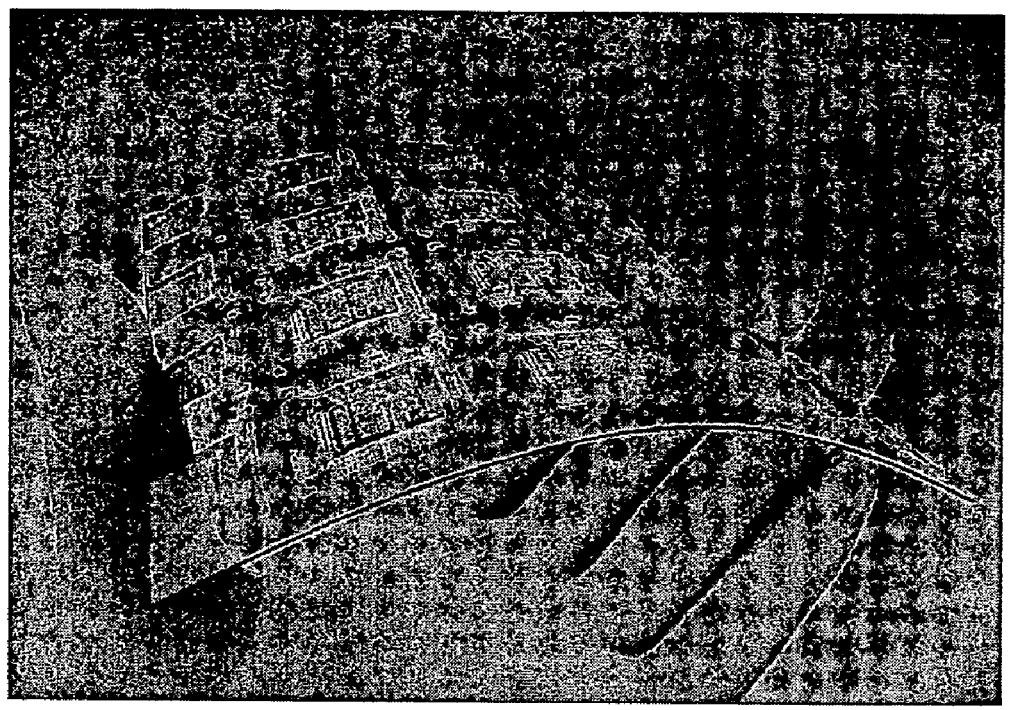
FIG. 8 is a photograph of a plurality of CPUs provided over a film substrate (Embodiment 1).

In this embodiment, approximately 27,000 TFTs are used to configure a CPU, and a layout having 10 $mm^2$ of chip area is achieved. As shown in FIG. 8, 12 chips can be formed in a substrate of 5 inches.

Figure 9:
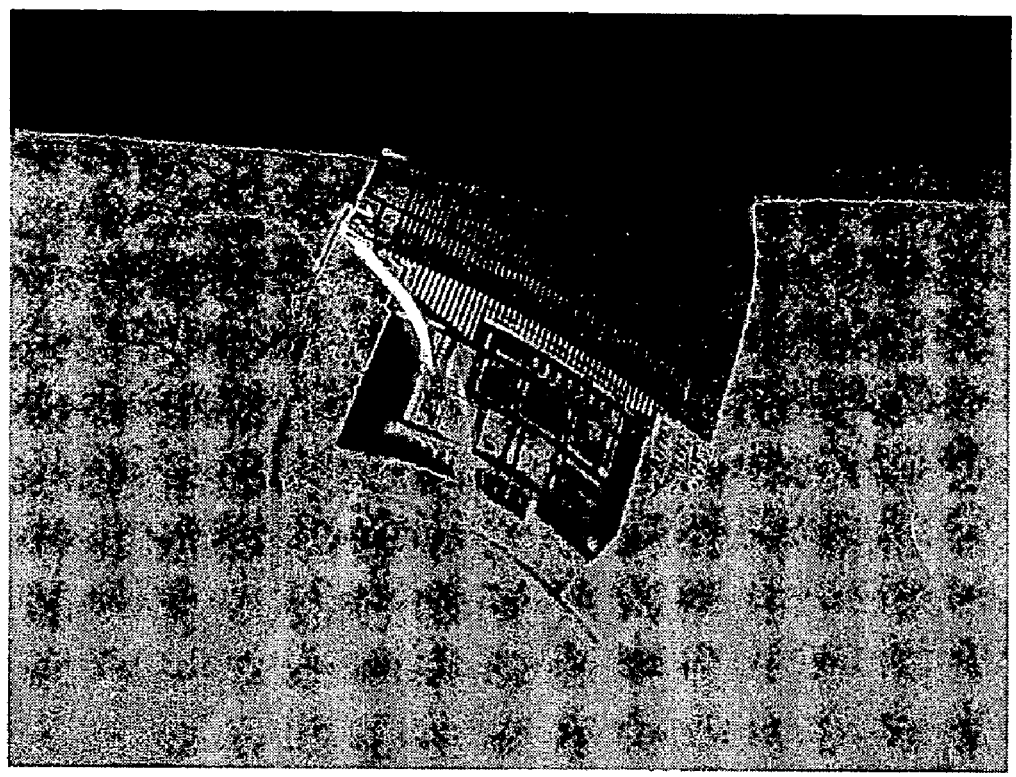
FIG. 9 is a photograph of a CPU in one chip provided over a plastic substrate (Embodiment 1).

FIG. 9 shows a photograph of one chip on which an FPC is pressure-bonded after division of the substrate. An FPC can be mounted without causing any disconnection defect such as a crack even when the FPC is pressure-bonded since the protective layer 14 is provided.

Figure 10:
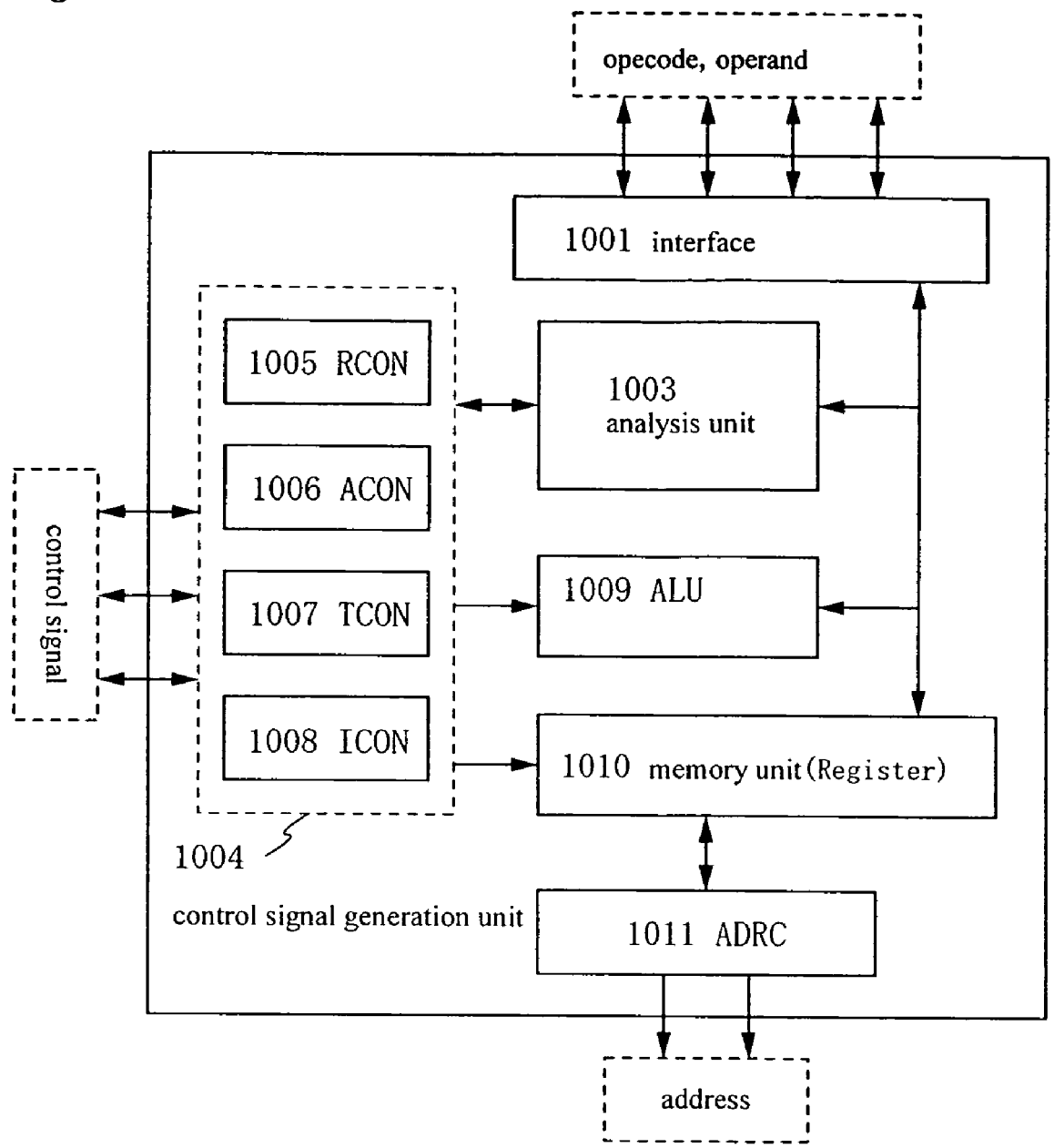
FIG. 10 is a block diagram (Embodiment 1).

FIG. 10 shows a block diagram of one chip and is describes hereinafter.

When an opecode is inputted into an interface 1001, the code is decrypted in an analysis unit 1003 (also referred to as an Instruction Decoder), and a signal is inputted into a control signal generation unit 1004 (a CPU Timing Control). When the signal is inputted, a control signal is outputted from the control signal generation unit 1004 to an arithmetic logical unit 1009 (hereinafter, an ALU) and a memory unit 1010 (hereinafter, a Register).

The control signal generation unit 1004 includes an ALU controller 1005 for controlling the ALU 1009 (hereinafter, an ACON), a unit 1006 for controlling the Register 1010

(hereinafter, a RCON), a timing controller 1007 for controlling timing (hereinafter, a TCON), and an interruption controller 1008 for controlling interruption (hereinafter, an ICON).

On the other hand, when an operand is inputted into the interface 1001, the operand is outputted to the ALU 1009 and the Register 1010. Then, a processing based on a control signal, which is inputted from the control signal generation unit 1004 (for example, a memory read cycle, a memory write cycle, an I/O read cycle, an I/O write cycle, or the like), is carried out.

The Register 1010 includes a general resister, a stack pointer (an SP), a program counter (a PC), and the like.

An address controller 1011 (hereinafter, an ADRC) outputs 16 bits address.

A structure of the CPU described in this embodiment is an example of a CPU manufactured according to the present invention and does not limit the structure of the invention. Therefore, it is possible to use a known structure of a CPU other than that shown in this embodiment.

Figure 11:
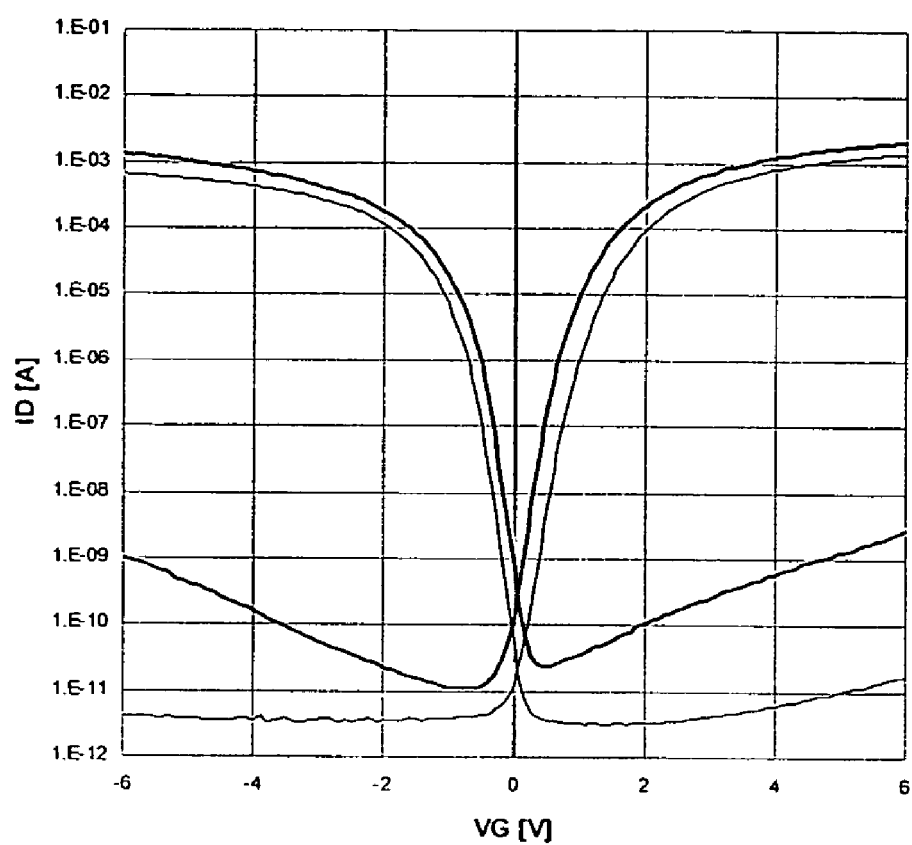
FIG. 11 shows current characteristics of a TFT (Embodiment 1).

Note that a graph shown in FIG. 11 is current characteristics of an n-channel TFT and a p-channel TFT having 1.2 mm of a gate length and 20 mm of a gate width. The n-channel TFT has a threshold voltage of 0.8 V; an S value, about 0.16 V/dec; a drain current, about 27 mA/mm (Vgs=3.3 V, Vds=1 V), while the p-channel TFT has a threshold voltage of 0.6 V; an S value, about 0.14 V/dec; a drain current, about 16 mA/mm (Vgs=−3.3 V, Vds=−1 V). Thus, a TFT with high properties can be achieved.

Figure 12:
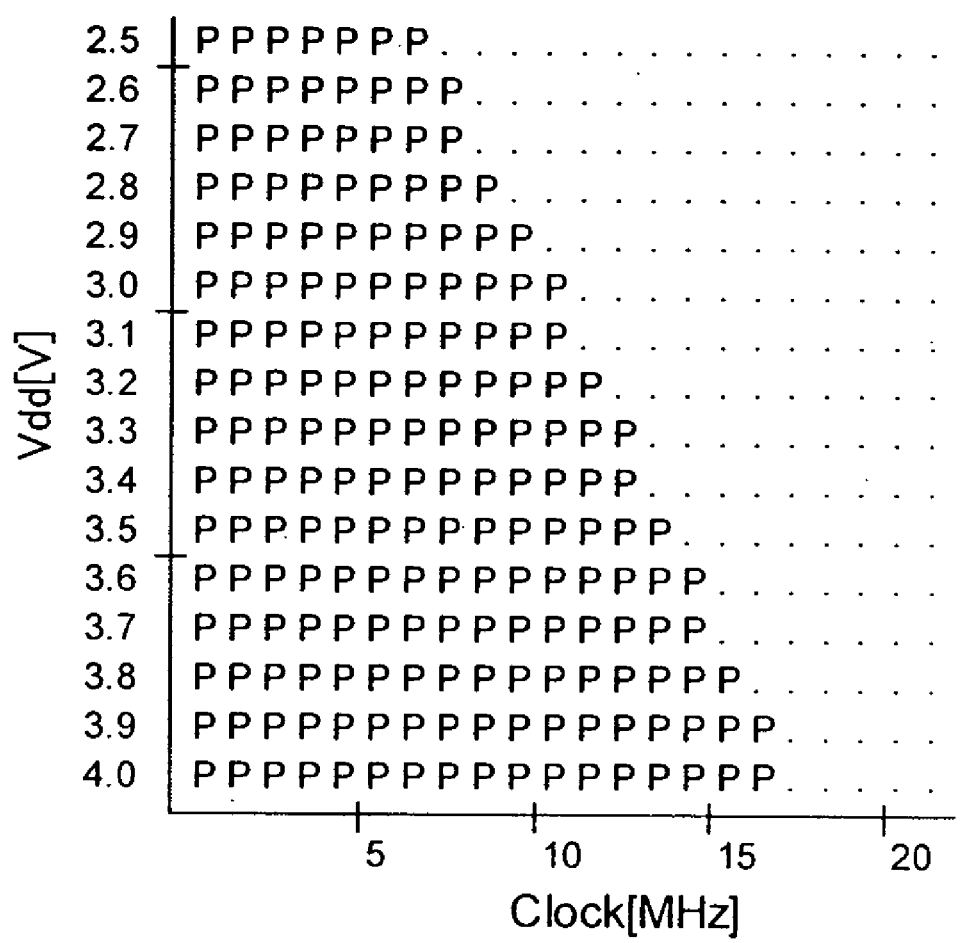
FIG. 12 shows an evaluation result of a CPU (Embodiment 1).

FIG. 12 shows the result of evaluation of the obtained CPU (a shmoo plot of a chip). Movement in an operation frequency of 13 MHz in a power supply voltage of 3.3 V is confirmed with reference to FIG. 12. In addition, with reference to FIG. 12, it is assumed that operation properties of a chip according to this embodiment is sufficiently within the range of practical use as an LSI for a relatively easy built-in type.

In this embodiment, a TFT having a single drain structure is explained. However, an LDD may be provided if necessary, or a multi-gate TFT having a plurality of channel formation regions, for example, a double gate TFT may be used.

This embodiment can be freely combined with Embodiment Mode 1 or Embodiment Mode 2.

Embodiment 2

In this embodiment, an example of manufacturing a light emitting device in which light emitting elements having a layer containing an organic compound are arranged in matrix is described.

Initially, an element is formed over a glass substrate (a first substrate 300). In this embodiment, AN100 manufactured by Asahi Glass Co., Ltd. is used as a glass substrate. A metal film 1301a and an oxide film 1302 are laminated over the substrate by sputtering same as Embodiment 1. In laminating, a metal oxide film (a tungsten oxide film) in an amorphous state is formed between the metal film 1301a and the silicon oxide film 1302 in approximately from 2 nm to 5 nm thick.

Then, the metal film, the metal oxide film, and the silicon oxide film which are formed at the edge face of the substrate are selectively removed by $O_2$ ashing or the like.

Then, a silicon oxynitride film (a film thickness of 100 nm) which serves as a base insulating film is formed by PCVD, and an amorphous silicon film containing hydrogen (a film thickness of 54 nm) is further laminated without being exposed to the atmospheric air.

Then, a TFT 1303 in which a polysilicon film serves as an active layer is formed by crystallizing the above-mentioned amorphous silicon film by a known technique (solid-phase growth, laser crystallization, crystallization using catalytic metal, or the like).

Then, a film containing an organic compound (hereinafter, referred to as an organic compound layer) is provided between a pair of electrodes (an anode and a cathode), and a light emitting element in which fluorescence or phosphorescence can be obtained by applying electric field between the pair of the electrodes is formed. Initially, a first electrode 1304 which serves as an anode or a cathode is formed. Here, an example in which a metal film having a high work function (Cr, Pt, W or the like), or a transparent conductive film (ITO (indium oxide tin oxide alloy), indium oxide zinc oxide alloy ($In_2O_3$—ZnO), zinc oxide (ZnO) or the like) is used as the first electrode 1304 and is functioned as an anode, is shown.

When the first electrode 1304 is used as the anode, it is preferable that the TFT 1303 is a p-channel TFT. In the case of connecting with the p-channel TFT, the TFT is connected with the anode, and after sequentially laminating a hole injecting layer/a hole transporting layer/a light emitting layer/an electron transporting layer over the anode, a cathode may be formed. In the case of connecting with the n-channel TFT, the TFT is connected with the cathode, and after sequentially laminating an electron transporting layer/a light emitting layer/a hole transporting layer/a hole injecting layer over the cathode, an anode may be formed.

When a source electrode or a drain electrode of a TFT serves as a first electrode, or a first electrode in contact with a source region or a drain region is formed separately, the TFT includes the first electrode.

A partition wall (also referred to as a bank, a barrier or the like) 1305a is formed on the both ends of the first electrode (anode) so as to encircle the periphery of the first electrode. To improve the coverage, the upper edge portion or the bottom edge portion of the partition wall is formed to have a curved surface having curvature. For example, in the case that a positive type photosensitive acrylic is used as a material for the partition wall, it is preferable that only the upper edge portion of the partition wall is formed to have a curved surface having radius of curvature (from 0.2 μm to 3 μm). Either a negative type that is insoluble in etchant according to light having a wavelength in which photosensitive acrylic reacts or a positive type that is dissoluble in etchant according to the light can be used as partition wall.

Further, in the case of laminating a plurality of organic resins, there is a possibility that the plurality of organic resins is partially melted at the time of applying or baking, or the plurality of organic resins are too adhesive between the organic resins depending on a used solvent. Therefore, in the case of using an organic resin as a material for the partition wall, the partition wall 1305a is preferably covered with an inorganic insulating film (an $SiN_x$ film, an $SiN_xO_y$ film, an $AlN_x$ film, or an $AlN_xO_y$ film) in order to make it easy to remove the water-soluble resin after coating it in a later step. The inorganic insulating film serves as a part of the partition wall 1305b (FIG. 13A).

Next, an adhesive material 1306 that is soluble in water or alcohols is coated over the entire surface and baked (FIG. 13B).

Then, after pasting a two-sided tape 1307 to the adhesive material 1306, treatment for partially weakening adhesion between the metal film 1301a and the metal oxide film

1301b, or between the metal oxide film 1301b and the oxide film 1302 is performed. Here, one side of the substrate is cut off with a CO$_2$ laser.

Then, a second substrate 1308 is pasted to the two-sided tape 1307. Further, a third substrate 1310 is pasted to the first substrate 1300 with the use of a two-sided tape 1309 (FIG. 13C).

Then, peeling is performed from a region where the adhesion is partially weakened. A state after peeling is shown in FIG. 13D.

Then, a fourth substrate 1312 and the oxide layer 1302 (and a peeling layer) are adhered together with an adhesive material 1311 (FIG. 13E).

A plastic substrate (ARTON made from a norbornene resin having a polar group, manufactured by JSR Corporation) is used for the fourth substrate 1312. In addition, a plastic substrate such as polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or polyimide can be used.

Then, the second substrate 1308 is separated from the two-sided tape 1307 (FIG. 13F).

Then, the two-sided tape 1307 is peeled (FIG. 13G).

Then, the adhesive material 1306 is dissolved and removed with the use of a solvent (FIG. 13H). If the adhesive material 1306 remains, it causes a defect. Therefore, it is preferable to make the surface of the first electrode 1304 clean with washing treatment or O$_2$ plasma treatment.

Then, the surface of the first electrode 1304 is rubbed and washed with a porous sponge (typically a sponge made of PVA (polyvinyl alcohol), or nylon) soaked in a surface-active agent (weak alkaline), if necessary.

Then, the substrate provided with the TFT and the partition wall is heated in vacuum for removing absorbed moisture in the entire substrate, right before forming a layer 1313 containing an organic compound. Further, the first electrode may be irradiated with ultraviolet ray right before forming the layer 1313 containing an organic compound.

Then, the layer 1313 containing an organic compound is selectively formed over the first electrode (the anode) by vapor deposition with the use of an evaporation mask or ink-jetting. As the layer 1313 containing an organic compound, a layer made from a high molecular weight material, low molecular weight material, an inorganic material, a mixed layer formed of these materials, a layer formed by dispersing these materials, or a lamination formed by appropriately combining these layers may be used.

Moreover, a second electrode (cathode) 1314 is formed over the layer containing an organic compound (FIG. 13I). As the cathode 1314, a lamination layer of a thin film, which has a film thickness enough to be transparent to light, formed of a material having a low work function (Al, Ag, Li, Ca, an alloy of these: MgAg, MgIn, AlLi, or a compound of these: CaF$_2$ or CaN) and a transparent conductive film may be used. In addition, a protective layer is formed to cover the second electrode by sputtering or vapor deposition, if necessary. As the protective layer, a silicon nitride film, a silicon oxide film, a silicon oxynitride film (a SiNO film: a ratio of N to O composition is N>O), or a SiON film (a ratio of N to O composition is N<O), or a thin film containing carbon as its main component (for example, a DLC film or a CN film), obtained by sputtering or CVD can be used.

A sealing material (not shown) containing a gap material for maintaining a gap between a pair of substrates is applied to a fifth substrate 1314 that serves as a sealing member. The fifth substrate 1314 may be a light-transmitting substrate in this embodiment since an example of the light emitting element in which light generated therein emits through the fifth substrate 1314 is described. Here, the same plastic substrate as the fourth substrate (ARTON, manufactured by JSR Corporation) is used to prevent a warp by equalizing the thermal expansion coefficient. The ARTON substrate is suitable for the fifth substrate since it is hardly birefringent and has a low water absorption rate. When a plastic substrate is used, it is preferable that a pretreatment for improving the adhesion between the plastic substrate and the sealing material is performed before a pattern of the sealing material (ethanol wiping, ultraviolet ray radiation, O$_2$ plasma treatment or the like) is drawn.

Thereafter, a few drops of sealing material with a low viscosity are dropped to paste the sealing substrate and an active matrix substrate with each other without generating air bubbles using a vacuum pasting device. The vacuum pasting device is of use particularly when a pair of flexible plastic substrates is pasted together. Moreover, a method for applying a few drops of the sealing material with low viscosity is also of use for pasting a pair of flexible substrates together. With this pasting step, sealing is performed in a manner where a light emitting region provided over an active matrix substrate is surrounded by sealing patterns provided over a sealing substrate. Further, sealing is performed in a manner where a space surrounded by the sealing material is filled with an adhesive material 315 formed from a transparent organic resin (FIG. 13J).

Through the above-mentioned steps, a light emitting device provided with a TFT and a light emitting element can be manufactured with plastic substrates 1312 and 1314 serving as holders. Since the holders are plastic substrates, the light emitting device can be thin, lightweight and flexible.

In the light emitting device of this embodiment, a method for driving screen display is not specifically limited, and a dot sequential drive system, a line sequential drive system, a area sequential drive system or the like may be employed. Typically, the line sequential drive system is employed, and a time division gradation sequence drive system or an area gradation drive system may be utilized as needed. The video signal to be inputted into a source line of the light emitting device may be either an analogs signal or a digital signal, and the drive circuit or the like may be appropriately designed corresponding to the video signal.

Further, in a light emitting device using a digital video signal, there are two kinds of video signals inputted into a pixel: a signal with constant voltage (CV) and a signal with constant current (CC). Further, as for the video signal with constant voltage (CV), there are two kinds: a signal in which voltage applied to a light emitting element is constant (CVCV), and a signal in which current applied to a light emitting element is constant (CVCC). In addition, as for the video signal with constant current (CC), there are two kinds: a signal in which voltage applied to a light emitting element is constant (CCCV), and a signal in which current applied to a light emitting element is constant (CCCC).

In the light emitting device of this embodiment, a protective circuit for preventing electrostatic discharge damage (a protective diode) may be provided.

This embodiment can be freely combined with any one of Embodiment Mode 1, Embodiment Mode 2, or Embodiment 1.

Embodiment 3

Various types of modules (an active matrix type EL module, a passive matrix type EL module, a liquid crystal display device, and an active matrix type EC module) can be completed by according to the present invention. In other words, electronic devices in all fields which mount the modules can be completed according to the invention.

Figure 14A:
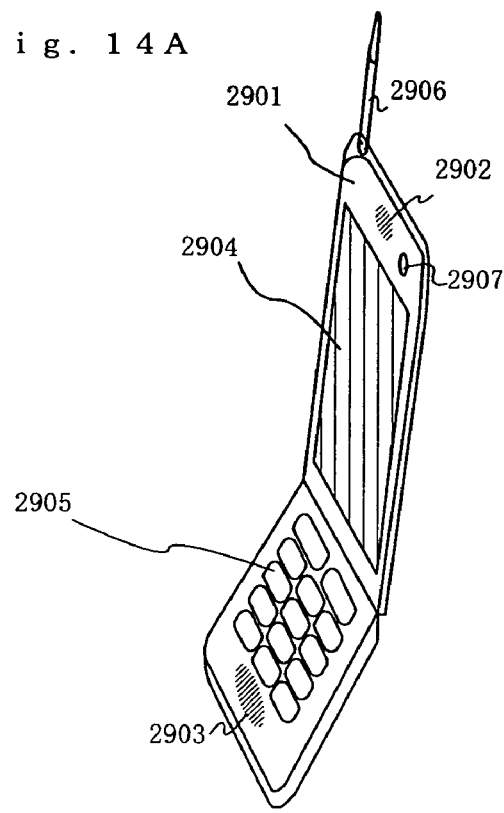
FIGS. 14A to 14C are diagrams showing examples of electronic devices (Embodiment 3).
Figure 14B:
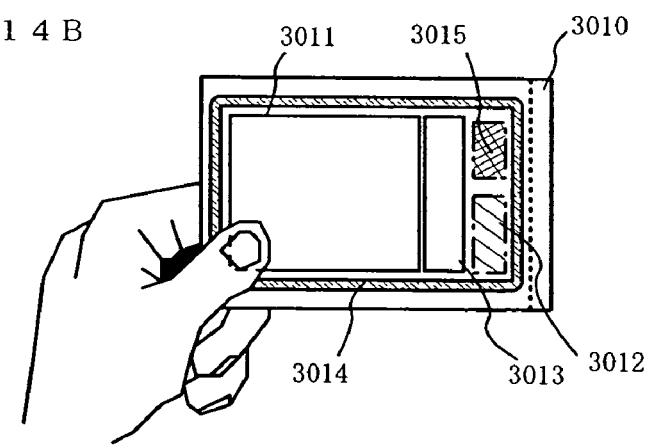
Figure 14C:
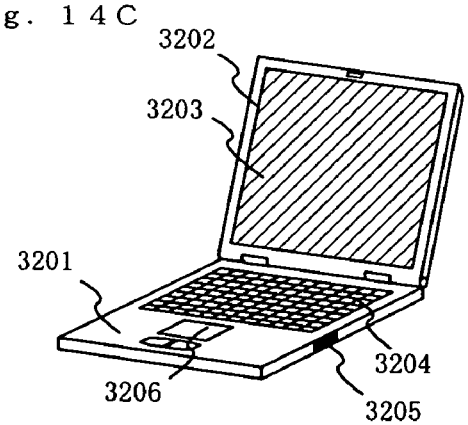

Examples of these kinds of electronic devices are as follows: a video camera; a digital camera; a head mounted display (a goggle type display); a car navigating system; a projector; a mobile stereo; a personal computer; a card; a personal digital assistant (a mobile computer, a cellular phone, an electronic book, and the like). FIGS. 14A to 14C show one example thereof.

FIG. 14A illustrates a cellular phone which includes a main body 2901, an audio output portion 2902, an audio input portion 2903, a display portion 2904, operation switches 2905, an antenna 2906, an image input portion (CCD, an image sensor, and the like) 2907, and the like. The display portion can be made thinner according to the invention transferred to a plastic substrate. Consequently, the total weight of the cellular phone can be made lightweight. In the display portion with the use of a plastic substrate, durability against the impact in falling can be enhanced.

FIG. 14B illustrates a card or a card type personal digital assistant which includes a display portion 3011, a driver circuit portion 3013, a functional circuit portion 3012 such as a CPU, a seal pattern 3014, a battery 3015, and a flexible substrate 3010. Although a mode in which two flexible substrates are sandwiched in FIG. 14B, the display portion 3011, the driver circuit portion 3013, the functional circuit portion 3102 such as a CPU may be provided over one flexible substrate. The weight of the personal digital assistant can be made lightweight since the personal digital assistant can be made wholly thinner according to the invention in which various functional circuits are transferred to a plastic substrate. Peeling and transferring to a plastic substrate may be performed by forming a functional circuit portion such as a display portion and a CPU over one glass substrate. Alternatively, a functional circuit portion such as a display portion and a CPU is separately formed over different glass substrates, and transferring to one plastic substrate may be performed after peeling.

FIG. 14C illustrates a lap-top personal computer, which includes a main body 3201, a casing 3202, a display portion 3203, a keyboard 3204, an external connection port 3205, a pointing mouse 3206 and the like. The display portion 3203 can be made thinner according to the invention transferred to a plastic substrate. According to the invention, a CPU (not shown) can be provided over a plastic substrate resulting in actualizing lightweight. In the display portion with the use of a plastic substrate, durability against the impact in falling can be enhanced.

As described above, a semiconductor device obtained according to the invention can be used as a part of any electronic devices. Note that a semiconductor device manufactured by using any configuration of Embodiment Mode 1, Embodiment Mode 2, Embodiment 1 or Embodiment 2 can be applied to the electronic devices in this embodiment.

According to the invention, peeling, transferring and mounting can be realized with a preferable yield, even when gang printing is performed with the use of a substrate having a large area.

According to the invention, gang printing can be performed over a film substrate. Accordingly, a cutting process to obtain a small-size circuit pattern can be performed easily with laser processing, a cutter, or the like. Therefore, a large number of minute devices can be manufactured with a preferable yield from a large-size substrate.

What is claimed is:

1. A method for manufacturing a semiconductor device, comprising the steps of:
    forming a peeling layer containing an element over a first substrate;
    applying an organic resin film which is dissolved in a solvent over the peeling layer containing an element;
    pasting a first two-sided tape over the organic resin film;
    cutting off and removing a part of the first substrate;
    pasting a second substrate to the first two-sided tape;
    pasting a third substrate under the first substrate with a second two-sided tape;
    performing peeling to separate the first substrate, the second two-sided tape, and the third substrate from the peeling layer;
    pasting a fourth substrate to the peeling layer with an adhesive material.

2. A method according to claim 1, wherein the part of the first substrate is in contact with a part of the organic resin film overlapped with the part of the first substrate.

3. A method for manufacturing a semiconductor device, comprising the steps of:
    forming a peeling layer containing an element and an alignment marker over a first substrate;
    forming an organic resin film which is dissolved in a solvent over the peeling layer containing an element;
    pasting a first two-sided tape over the organic resin film;
    cutting off and removing a part of the first substrate which is overlapped with the alignment marker;
    pasting a second substrate to the first two-sided tape;
    pasting a third substrate under the first substrate with a second two-sided tape;
    performing peeling to separate the first substrate, the second two-sided tape, and the third substrate from the peeling layer;
    pasting a fourth substrate to the peeling layer with an adhesive material.

4. A method for manufacturing a semiconductor device according to claim 1 or claim 3, wherein the second substrate and the third substrate have higher rigidity than that of the first substrate, and the fourth substrate is a film substrate.

5. A method according to claim 1 or 3, wherein said peeling is performed from a part where the part of the first substrate is cut off and removed.

6. A method according to claim 1 or 3, further comprising steps of:
    removing the second substrate;
    removing the first two-sided tape; and
    removing the organic resin film by dissolving with a solvent.

7. A method according to claim 1 or 3, wherein said element is a TFT element.

8. A method according to claim 3, wherein the part of the first substrate is in contact with a part of the organic resin film overlapped with the part of the first substrate.

9. A method for manufacturing a semiconductor device, comprising the steps of:
    forming a peeling layer containing an element over a first substrate;
    forming an organic resin film which is dissolved in a solvent over the peeling layer containing an element;
    pasting a two-sided tape over the organic resin film;
    cutting off and removing a part of the first substrate;
    pasting a second substrate to the two-sided tape;

performing peeling to separate the first substrate from the peeling layer;

pasting a third substrate to the peeling layer with an adhesive material.

10. A method for manufacturing a semiconductor device according to claim 9, wherein the second substrate has higher rigidity than that of the first substrate, and the third substrate is a film substrate.

11. A method according to claim 9, wherein said peeling is performed from a part where the part of the first substrate is cut off and removed.

12. A method according to claim 9, further comprising steps of:
 removing the second substrate;
 removing the two-sided tape; and
 removing the organic resin film by dissolving with a solvent.

13. A method according to claim 9, wherein said element is a TFT element.

14. A method according to claim 9, wherein the part of the first substrate is in contact with a part of the organic resin film overlapped with the part of the first substrate.

15. A method for manufacturing a semiconductor device, comprising the steps of:
 forming a peeling layer containing an element over a first substrate;
 forming an organic resin film which is dissolved in a solvent over the peeling layer containing an element;
 exposing a bonding face of a two-sided tape;
 pasting the bonding face of the two-sided tape to the organic resin film;
 cutting off and removing a part of the first substrate and exposing a part of the bonding face of the two-sided tape;
 exposing the other bonding face of the two-sided tape by peeling a protective sheet;
 pasting a second substrate to the other bonding face of the two-sided tape after peeling the protective sheet;
 performing peeling to separate the first substrate from the peeling layer;
 pasting a third substrate to the peeling layer with an adhesive material.

16. A method for manufacturing a semiconductor device according to claim 15, wherein the second substrate has higher rigidity than that of the first substrate, and the third substrate is a film substrate.

17. A method according to claim 15, wherein said peeling is performed from a part where the part of the first substrate is cut off and removed.

18. A method according to claim 15, further comprising steps of:
 removing the second substrate;
 removing the two-sided tape; and
 removing the organic resin film by dissolving with a solvent.

19. A method according to claim 15, wherein the part of the first substrate is in contact with a part of the organic resin film overlapped with the part of the first substrate.

20. A method according to claim 15, wherein said element is a TFT element.

* * * * *